United States Patent
Kimura et al.

(10) Patent No.: US 8,183,737 B2
(45) Date of Patent: *May 22, 2012

(54) SURFACE ACOUSTIC WAVE DEVICE INCLUDING ELECTRODE FINGERS PARTIALLY DISPOSED IN GROOVES IN A PIEZOELECTRIC SUBSTRATE

(75) Inventors: Tetsuya Kimura, Nagaokakyo (JP);
Michio Kadota, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/021,816

(22) Filed: Feb. 7, 2011

(65) Prior Publication Data

US 2011/0133600 A1    Jun. 9, 2011

Related U.S. Application Data

(63) Continuation of application No. PCT/JP2009/003395, filed on Jul. 21, 2009.

(30) Foreign Application Priority Data

Aug. 8, 2008  (JP) ................... 2008-205781
Dec. 22, 2008  (JP) ................... 2008-325356

(51) Int. Cl.
H03H 9/25    (2006.01)
H01L 41/04    (2006.01)
(52) U.S. Cl. ................. 310/313 B; 310/313 R
(58) Field of Classification Search ........... 310/313
See application file for complete search history.

(56) References Cited

U.S. PATENT DOCUMENTS 5,130,257 A  *  7/1992  Baer et al. ................. 436/151
(Continued)

FOREIGN PATENT DOCUMENTS

JP          06-112763 A        4/1994
(Continued)

OTHER PUBLICATIONS

Official Communication issued in International Patent Application No. PCT/JP2009/003395, mailed on Aug. 18, 2009.

*Primary Examiner* — Jaydi San Martin
(74) *Attorney, Agent, or Firm* — Keating & Bennett, LLP

(57) ABSTRACT

An elastic wave device has a low temperature coefficient of frequency (TCF), a low insertion loss, a high electromechanical coupling coefficient ($k^2$), and an increased pitch of the electrode fingers. The elastic wave device includes a piezoelectric component, IDT electrodes, and a dielectric layer arranged to cover the IDT electrodes. The dielectric layer has a temperature coefficient of frequency, the sign of the temperature coefficient of frequency being opposite to that of the temperature coefficient of frequency of the piezoelectric component, or the sign of the temperature coefficient of frequency being the same as that of the temperature coefficient of frequency of the piezoelectric component, and the absolute value of the TCF being smaller than that of the temperature coefficient of frequency of the piezoelectric component. Electrode fingers of the IDT electrodes each include a first electrode layer and a second electrode layer. Each first electrode layer is located in a corresponding one of a plurality of grooves. Each second electrode layer is located above the top of a corresponding one of the grooves. The one-half power of the product of the cube of the mean density ($\rho_a$) and the mean stiffness ($C44_a$) of the first electrode layer, i.e., $(\rho^3 \times C44)^{1/2}$ of the first electrode layer is larger than $(\rho^3 \times C44)^{1/2}$ of the second electrode layer.

13 Claims, 16 Drawing Sheets

U.S. PATENT DOCUMENTS

| | | | |
|---|---|---|---|
| 5,434,465 A | 7/1995 | Sato et al. | |
| 7,425,788 B2 * | 9/2008 | Kadota et al. | 310/313 B |
| 7,564,174 B2 * | 7/2009 | Matsuda et al. | 310/346 |
| 7,737,603 B2 * | 6/2010 | Kando | 310/313 R |
| 7,876,021 B2 * | 1/2011 | Kadota et al. | 310/313 B |
| 7,956,511 B2 * | 6/2011 | Kadota et al. | 310/313 B |
| 7,956,512 B2 * | 6/2011 | Kadota et al. | 310/313 B |
| 2006/0158800 A1 | 7/2006 | Takayama et al. | |
| 2007/0120439 A1 | 5/2007 | Kadota et al. | |
| 2009/0152993 A1 | 6/2009 | Kando | |
| 2009/0189483 A1 * | 7/2009 | Kadota et al. | 310/313 B |

FOREIGN PATENT DOCUMENTS

| | | |
|---|---|---|
| JP | 08-204493 A | 8/1996 |
| JP | 2004-207998 A | 7/2004 |
| JP | 2006-270906 A | 10/2006 |
| WO | 98/52279 A1 | 11/1998 |
| WO | 2006/011417 A1 | 2/2006 |
| WO | 2008/035546 A1 | 3/2008 |

* cited by examiner

WAVELENGTH-NORMALIZED THICKNESS OF DIELECTRIC LAYER 20 (h/λ)

SURFACE ACOUSTIC WAVE DEVICE INCLUDING ELECTRODE FINGERS PARTIALLY DISPOSED IN GROOVES IN A PIEZOELECTRIC SUBSTRATE

BACKGROUND OF THE INVENTION

1. Field of the Invention

The present invention relates to an elastic wave device for use in, for example, resonators and band pass filters, and more particularly, to an elastic wave device including IDT electrodes covered with an insulating layer.

2. Description of the Related Art

Duplexers (DPXs) and RF filters for use in, for example, mobile communication systems are required to have wide band widths and satisfactory temperature characteristics. With respect to a surface acoustic wave device having a wide band width and satisfactory temperature characteristics, for example, International Publication No. WO 2006/011417 A1 discloses a surface acoustic wave device in which Al IDT electrodes embedded in a LiTaO$_3$ substrate are covered with a SiO$_2$ layer having a positive temperature coefficient of frequency (TCF). Like the surface acoustic wave device disclosed in International Publication No. WO 2006/011417 A1, embedding the IDT electrodes in the piezoelectric substrate provides a high electromechanical coupling coefficient ($k^2$), thereby achieving a wide band width. Furthermore, covering the IDT electrodes with the SiO$_2$ layer having a positive TCF achieves satisfactory temperature characteristics.

For an acoustic wave device with IDT electrodes that are embedded in a piezoelectric substrate, the IDT electrodes preferably have a higher density in order to achieve a higher electromechanical coupling coefficient ($k^2$). From the viewpoint of reducing insertion loss, electrode fingers of the IDT electrodes made of a material with a low resistivity are preferably formed so as to have a large thickness to reduce the resistance of the electrode fingers.

However, in the case where IDT electrodes with a high density are formed so as to have a large thickness, the acoustic velocity of an elastic wave tends to be low. Thus, for example, in the case where an elastic wave device using an elastic wave in a high-frequency band, for example, a several hundred megahertz to several gigahertz band, is formed, it is necessary to disadvantageously reduce the pitch of electrode fingers of the IDT electrodes. A reduction in the pitch of the electrode fingers is liable to cause a reduction in the static electricity resistance of the elastic wave device and the occurrence of a ripple due to an elastic wave in a transverse mode.

SUMMARY OF THE INVENTION

Preferred embodiments of the present invention provide an elastic wave device which has a low temperature coefficient of frequency (TCF), a low insertion loss, a high electromechanical coupling coefficient ($k^2$), and an increased pitch of the electrode fingers.

An elastic wave device according to a preferred embodiment of the present invention includes a piezoelectric component, an IDT electrode, and a dielectric layer. The piezoelectric component includes a plurality of grooves. The IDT electrode includes a plurality of electrode fingers. A portion of each of the electrode fingers is located in the plurality of grooves located in the piezoelectric component. The dielectric layer is arranged on the piezoelectric component so as to cover the IDT electrodes. The dielectric layer has a temperature coefficient of frequency, the sign of the temperature coefficient of frequency being opposite to that of the temperature coefficient of frequency of the piezoelectric component, or the sign of the temperature coefficient of frequency of the dielectric layer being the same as that of the temperature coefficient of frequency of the piezoelectric component, and the absolute value of the temperature coefficient of frequency of the dielectric layer being smaller than that of the temperature coefficient of frequency of the piezoelectric component. Each of the electrode fingers includes a first electrode layer and a second electrode layer. The first electrode layers are located in the grooves. The second electrode layers are disposed on the first electrode layers. The second electrode layers are located above the tops of the grooves. The one-half power of the product of the cube of the mean density ($\rho_a$) and the mean stiffness ($C44_a$) of the first electrode layer, i.e., $(\rho_a^3 \times C44_a)^{1/2}$, is larger than the one-half power of the product of the cube of the mean density ($\rho_b$) and the mean stiffness ($C44_b$) of the second electrode layer, i.e., $(\rho_b^3 \times C44_b)^{1/2}$.

According to a preferred embodiment of the present invention, the elastic wave device preferably satisfies $(\rho_a^3 \times C44_a)^{1/2} > 1.95 \times 10^{11} > (\rho_b^3 \times C44_b)^{1/2}$. In this case, it is possible to further reduce the insertion loss. Furthermore, a higher electromechanical coupling coefficient is obtained, thereby achieving a wider band width. Moreover, the acoustic velocity can be increased, so that the pitch of the electrode fingers can be increased. It is thus possible to enhance the resistance to static electricity and the ease of the production.

In another preferred embodiment of the present invention, the first electrode layer preferably is substantially made of a metal selected from the group consisting of Mo, Ta, Pt, Au, and W, or an alloy mainly containing at least one metal selected from the group.

In another specific preferred embodiment of the present invention, the second electrode layer preferably is substantially made of a metal selected from the group consisting of Al, Ti, and Cu, or an alloy mainly containing at least one metal selected from the group.

In another specific preferred embodiment of the present invention, at least one of the first and second electrode layers includes a plurality of metal films.

In another specific preferred embodiment of the present invention, the second electrode layer preferably includes a plurality of metal films, and at least one of the metal films constituting the second electrode layer is substantially made of Cr, Ni, or an alloy mainly containing at least one metal selected from Cr and Ni.

In another specific preferred embodiment of the present invention, the dielectric layer preferably is a SiO$_2$ layer, a silicon nitride layer, or a layer mainly containing SiO$_2$ or silicon nitride.

In another specific preferred embodiment of the present invention, a surface of the dielectric layer opposite the surface adjacent to the piezoelectric component is substantially flat. In this case, it is possible to further reduce the insertion loss.

In another specific preferred embodiment of the present invention, a surface of the dielectric layer opposite the surface adjacent to the piezoelectric component has an uneven shape corresponding to the shapes of the plurality of electrode fingers. In this case, it is possible to further increase the reflection coefficient.

In another specific preferred embodiment of the present invention, a wavelength-normalized thickness (h/λ) defined by normalizing the thickness (h) of the dielectric layer by the wavelength (λ) of an elastic wave at a portion where the electrode fingers are located is in the range of about 0.01 to about 0.4. In this case, it is possible to further reduce the TCF.

In another specific preferred embodiment of the present invention, the piezoelectric component preferably is a LiTaO$_3$ substrate or a LiNbO$_3$ substrate.

In another specific preferred embodiment of the present invention, the elastic wave device preferably is a surface acoustic wave device.

In another specific preferred embodiment of the present invention, a boundary acoustic wave preferably is used as an elastic wave. In this case, the elastic wave device preferably is a boundary acoustic wave device according to a preferred embodiment of the present invention.

In an elastic wave device according to a preferred embodiment of the present invention, each of the electrode fingers includes the first electrode layer and the second electrode layer, the first electrode layers being located in the grooves, and the second electrode layers being arranged on the first electrode layers and located above the tops of the grooves, and the one-half power of the product of the cube of the mean density ($\rho_a$) and the mean stiffness (C44$_a$) of the first electrode layer, i.e., $(\rho_a^3 \times C44_a)^{1/2}$, is preferably set to a value greater than the one-half power of the product of the cube of the mean density ($\rho_b$) and the mean stiffness (C44$_b$) of the second electrode layer, i.e., $(\rho_b^3 \times C44_b)^{1/2}$. Thus, it is possible to further reduce the insertion loss. Furthermore, a higher electromechanical coupling coefficient is obtained, thereby achieving a wider band width. Moreover, the acoustic velocity can be increased, so that the pitch of the electrode fingers can be increased. It is thus possible to enhance the resistance to static electricity and the ease of the production.

Furthermore, in the elastic wave device according to a preferred embodiment of the present invention, the IDT electrodes are covered with the dielectric layer having a temperature coefficient of frequency, and the sign of the temperature coefficient of frequency being opposite to that of the temperature coefficient of frequency of the piezoelectric component, or the sign of the temperature coefficient of frequency of the dielectric layer being the same as that of the temperature coefficient of frequency of the piezoelectric component, and the absolute value of the temperature coefficient of frequency of the dielectric layer being smaller than that of the temperature coefficient of frequency of the piezoelectric component. This makes it possible to reduce the temperature coefficient of frequency.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

The present invention will be described below by illustrating specific preferred embodiments of the present invention with reference to the drawings.

Figure 1:
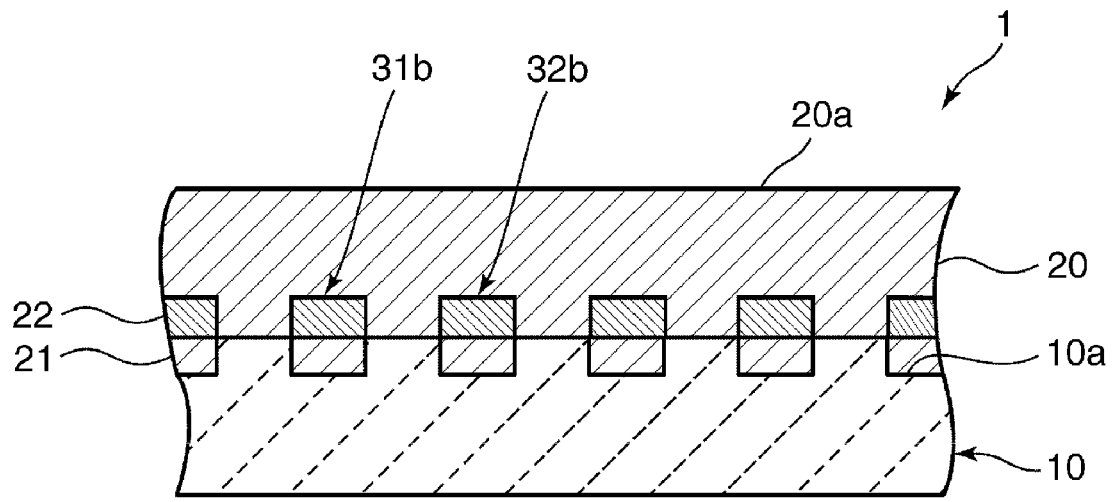
FIG. 1 is a schematic cross-sectional view of a surface acoustic wave device according to a preferred embodiment of the present invention.
Figure 2:
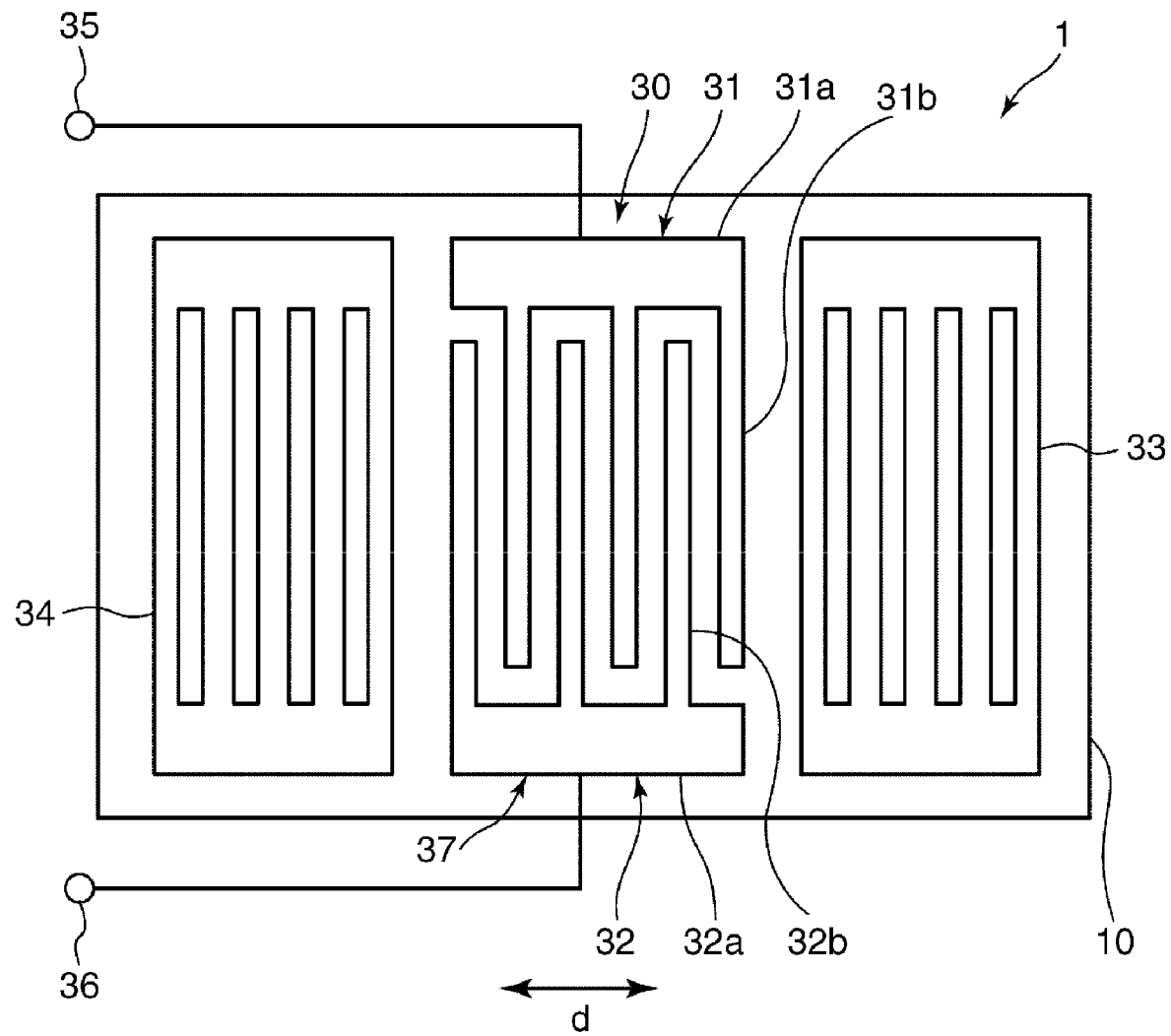
FIG. 2 is a schematic plan view of the surface acoustic wave device according to a preferred embodiment of the present invention.

FIG. 1 is a schematic cross-sectional view of a surface acoustic wave device 1 according to a preferred embodiment of the present invention. FIG. 2 is a schematic plan view of the surface acoustic wave device 1 according to this preferred embodiment. As illustrated in FIGS. 1 and 2, the surface acoustic wave device 1 includes a piezoelectric component 10. The piezoelectric component 10 may be made of, for example, a LiTaO$_3$ substrate or a LiNbO$_3$ substrate, without limitation.

As illustrated in FIG. 2, an electrode 30 is disposed on the piezoelectric component 10. The electrode 30 includes IDT electrodes 37. Reflectors 33 and 34 are arranged on both sides of the IDT electrodes 37 in the propagation direction d of a surface acoustic wave. The IDT electrodes 37 include first and second comb-shaped electrodes 31 and 32 that are interdigitated with each other. The first comb-shaped electrode 31 is electrically connected to a first terminal 35. The second comb-shaped electrode 32 is electrically connected to a second terminal 36.

The first comb-shaped electrode 31 includes a first busbar 31a and a plurality of first electrode fingers 31b that are connected to the first busbar 31a. The plurality of first electrode fingers 31b are arranged parallel or substantially parallel to each other. The second comb-shaped electrode 32 includes a second busbar 32a and a plurality of second electrode fingers 32b that are connected to the second busbar 32a. The plurality of second electrode fingers 32b are arranged parallel or substantially parallel to each other. The plurality of second electrode fingers 32b and the plurality of first electrode fingers 31b are alternately arranged in the propagation direction d of a surface acoustic wave. A portion of each first electrode finger 31b and a portion of each second electrode finger 32b are located in a plurality of grooves 10a formed in the piezoelectric component 10.

As illustrated in FIG. 1, the first and second electrode fingers 31b and 32b include first electrode layers 21 and second electrode layers 22. The first electrode layers 21 are arranged in the plurality of grooves 10a formed in the piezoelectric component 10. A surface of each of the first electrode layers 21 is substantially flush with a surface of a portion of the piezoelectric component 10 where the grooves 10a are not formed.

Each of the second electrode layers 22 is preferably disposed on a corresponding one of the first electrode layers 21. Each second electrode layer 22 is located above the top of the corresponding groove 10a. That is, the second electrode layers 22 are preferably disposed not in the grooves 10a, but outside the grooves 10a.

In this preferred embodiment, the one-half power of the product of the cube of the mean density ($\rho_a$ (kg/m$^3$)) and the mean stiffness (C44$_a$ (N/m$^2$)) of the first electrode layers 21, i.e., $(\rho_a^3 \times C44_a)^{1/2}$, is preferably set to a value greater than the one-half power of the product of the cube of the mean density ($\rho_b$ (kg/m$^3$)) and the mean stiffness (C44$_b$ (N/m$^2$)) of the second electrode layers 22, i.e., $(\rho_b^3 \times C44_b)^{1/2}$. That is, in this preferred embodiment, the first electrode layers 21 having a high value of $(\rho^3 \times C44)^{1/2}$ are embedded in the grooves 10a. The second electrode layers 22 having a low value of $(\rho^3 \times C44)^{1/2}$ are disposed above the tops of the grooves 10a.

This results in an increased electromechanical coupling coefficient (k$^2$), as supported by the following examples, thereby achieving a wider band width of the surface acoustic wave device 1. Furthermore, the resistance of each of the first and second electrode fingers 31b and 32b can be reduced while a reduction in reflection coefficient is suppressed, thereby increasing the acoustic velocity of a surface acoustic wave. This makes it possible to increase the pitch of the first and second electrode fingers 31b and 32b. In other words, it is possible to produce the surface acoustic wave device 1 usable for a higher-frequency band without reducing the pitch of the first and second electrode fingers 31b and 32b, thereby increasing the resistance to static electricity and preventing the occurrence of a ripple due to a transverse mode. Moreover, it is possible to increase the ease of production of the surface acoustic wave device 1.

In the case in which at least a portion of each first electrode layer 21 having a high value of $(\rho^3 \times C44)^{1/2}$ is arranged above the tops of the grooves 10a, the electromechanical coupling coefficient (k$^2$) tends to decrease. Meanwhile, in the case in which the second electrode layers 22 having a low value of $(\rho^3 \times C44)^{1/2}$ are arranged in the grooves 10a, the reflection coefficient tends to decrease.

In the case in which the second electrode layers 22 having a low value of $(\rho^3 \times C44)^{1/2}$ are not arranged and in which only the first electrode layers 21 having a high value of $(\rho^3 \times C44)^{1/2}$ have a large thickness to reduce the resistance, the acoustic velocity of a surface acoustic wave is reduced. Thus, the pitch of the first and second electrode fingers 31b and 32b tends to decrease.

From the viewpoint of increasing the electromechanical coupling coefficient (k$^2$), reducing the insertion loss, and increasing the acoustic velocity of a surface acoustic wave, the first electrode layers 21 and the second electrode layers 22 are preferably formed so as to satisfy $(\rho_a^3 \times C44_a)^{1/2} > 1.95 \times 10^{11} > (\rho_b^3 \times C44_b)^{1/2}$.

The structure of each of the first and second electrode layers 21 and 22 is not particularly limited so long as the relationship $(\rho_a^3 \times C44_a)^{1/2} > (\rho_b^3 \times C44_b)^{1/2}$ is satisfied. Each of the first and second electrode layers 21 and 22 may include a single metal film or a laminate of a plurality of metal films.

In the case where each first electrode layer 21 includes a single metal film, each first electrode layer 21 is preferably composed of a metal or an alloy material having a high value of $(\rho^3 \times C44)^{1/2}$. More preferably, each first electrode layer 21 is composed of a metal or an alloy material in which the value of $(\rho^3 \times C44)^{1/2}$ exceeds $1.95 \times 10^{11}$. Specifically, preferably, the first electrode layers 21 preferably are substantially composed of a metal selected from the group consisting of Mo, Ta, Pt, Au, and W, or an alloy mainly containing at least one metal selected from the group.

In the case in which each of the second electrode layers 22 includes a single metal film, each second electrode layer 22 is preferably composed of a metal or an alloy material having a low value of $(\rho^3 \times C44)^{1/2}$. More preferably, each second electrode layer 22 is composed of a metal or an alloy material in which the value of $(\rho^3 \times C44)^{1/2}$ is less than $1.95 \times 10^{11}$. Specifically, preferably, the second electrode layers 22 are substantially composed of a metal selected from the group consisting of Al, Ti, and Cu or an alloy mainly containing at least one metal selected from the group.

In the case where each of the first electrode layers 21 includes a laminate of a plurality of metal films, the mean density of the first electrode layers 21 ($\rho_a$ (kg/m$^3$)) is a value determined by dividing the sum of the products of the densities and the thicknesses of the metal films constituting each first electrode layer 21 by the sum of the thicknesses of the metal films. The mean stiffness of the first electrode layers 21 (C44$_a$ (N/m$^2$)) is a value determined by dividing the sum of the products of the stiffness and the thicknesses of the metal films constituting each first electrode layer 21 by the sum of the thicknesses of the metal films.

In the case in which each of the second electrode layers 22 includes a laminate of a plurality of metal films, the mean density of the second electrode layers 22 ($\rho_b$ (kg/m$^3$)) is a value determined by dividing the sum of the products of the densities and the thicknesses of the metal films constituting each second electrode layer 22 by the sum of the thicknesses of the metal films. The mean stiffness of the second electrode layers 22 (C44$_b$ (N/m$^2$)) is a value determined by dividing the sum of the products of the stiffness and the thicknesses of the metal films constituting each second electrode layer 22 by the sum of the thicknesses of the metal films.

Thus, in the case where at least one of the first and second electrode layers 21 and 22 includes a laminate of a plurality of metal films, a metal film composed of a metal or an alloy material in which at least one of the density and the stiffness is lower than that of the electrode film constituting each second electrode layer 22 may be present in the plurality of metal films constituting each first electrode layer 21. Furthermore, a metal film composed of a metal or an alloy material in which at least one of the density and the stiffness is higher than that of the electrode film constituting each first electrode layer 21 may be present in the metal films constituting each second electrode layer 22. Specifically, some of the metal films constituting each second electrode layer 22 may be composed of Cr or Ni.

Table 1 shows $(\rho^3 \times C44)^{1/2}$ of exemplary metal materials that can be used for the first and second electrode layers 21 and 22.

TABLE 1

|    | Density (kg/m³) ($\rho$) | Stiffness (N/m²) (C44) | $(\rho^3 \times C44)^{1/2}$ |
|----|--------------------------|------------------------|------------------------------|
| Al | $2.70 \times 10^3$       | $2.61 \times 10^{10}$  | $2.27 \times 10^{10}$        |
| Ti | $4.51 \times 10^3$       | $4.67 \times 10^{10}$  | $6.54 \times 10^{10}$        |
| Cu | $8.93 \times 10^3$       | $5.14 \times 10^{10}$  | $1.91 \times 10^{11}$        |
| Ag | $1.05 \times 10^4$       | $3.29 \times 10^{10}$  | $1.95 \times 10^{11}$        |
| Cr | $7.19 \times 10^3$       | $1.15 \times 10^{11}$  | $2.07 \times 10^{11}$        |
| Ni | $8.85 \times 10^3$       | $9.29 \times 10^{10}$  | $2.54 \times 10^{11}$        |
| Mo | $1.02 \times 10^4$       | $1.07 \times 10^{11}$  | $3.38 \times 10^{11}$        |
| Au | $1.93 \times 10^4$       | $2.99 \times 10^{10}$  | $4.64 \times 10^{11}$        |
| Ta | $1.67 \times 10^4$       | $8.25 \times 10^{10}$  | $6.19 \times 10^{11}$        |
| Pt | $2.14 \times 10^4$       | $5.97 \times 10^{10}$  | $7.65 \times 10^{11}$        |
| W  | $1.93 \times 10^4$       | $1.60 \times 10^{11}$  | $1.07 \times 10^{12}$        |

As illustrated in FIG. 1, a dielectric layer 20 is arranged on the piezoelectric component 10 so as to cover the electrode 30.

The dielectric layer 20 is composed of a material having a temperature coefficient of frequency (TCF), the sign of the TCF being opposite to that of the TCF of the piezoelectric component 10. Alternatively, the dielectric layer 20 is composed of a material with a TCF, the sign of the TCF being the same as that of the TCF of the piezoelectric component 10, and the absolute value of the TCF being smaller than that of the TCF of the piezoelectric component 10. This achieves a low TCF.

From the viewpoint of achieving a lower TCF, the dielectric layer 20 preferably has a temperature coefficient of frequency (TCF) with a sign opposite to that of the TCF of the piezoelectric component 10. For example, preferably, the piezoelectric component 10 has a negative TCF, and the dielectric layer 20 has a positive TCF. Specifically, for example, in the case where the piezoelectric component 10 is substantially composed of LiTaO₃ or LiNbO₃ having a negative TCF, the dielectric layer 20 is preferably a SiO₂ layer, a silicon nitride layer, such as a SiN layer, or a layer mainly composed of SiO₂ or silicon nitride, which has a positive TCF.

The thickness of the dielectric layer 20 is not particularly limited. Preferably, a wavelength-normalized thickness (h/λ) defined by normalizing the thickness (h) of the dielectric layer 20 by the wavelength (λ) of an elastic wave at a portion where the electrode fingers 31b and 32b are formed is preferably in the range of about 0.01 to about 0.4, for example. In this case, a lower TCF is achieved.

In particular, in the case where the piezoelectric component 10 is composed of LiNbO₃ and where the dielectric layer 20 is composed of SiO₂, more preferably, the wavelength-normalized thickness (h/λ) is about 0.1 or more, for example. In this case, it is possible to obtain a high reflection coefficient and a high electromechanical coupling coefficient ($k^2$).

A surface 20a of the dielectric layer 20 opposite to the surface that is adjacent to the piezoelectric component 10 may have a substantially flat shape or an uneven shape corresponding to the shapes of the electrode fingers 31b and 32b. The substantially flat shape of the surface 20a of the dielectric layer 20 results in a reduction in insertion loss. Meanwhile, the uneven shape, corresponding to the shapes of the electrode fingers 31b and 32b, of the surface 20a of the dielectric layer 20 results in an increase in reflection coefficient.

In this preferred embodiment, the elastic wave device according to the present invention has been described by taking the surface acoustic wave device 1 illustrated in FIGS. 1 and 2 as an example. However, the elastic wave device according to the present invention is not limited to a surface acoustic wave device. The elastic wave device according to the present invention may be a boundary acoustic wave device using a Stoneley wave or a SH-type boundary wave.

Furthermore, in this preferred embodiment, while the elastic wave device has been described by referring to a resonator as an example, the elastic wave device according to the present invention is not limited to the resonator. For example, the elastic wave device may be a filter using an elastic wave. Specific examples of the filter include longitudinally coupled resonator-type filters and ladder filters.

EXAMPLES 1 AND 2 AND COMPARATIVE EXAMPLES 1 AND 2

In Example 1, the surface acoustic wave devices 1 illustrated in FIGS. 1 and 2 were produced under conditions described below. The reflection coefficients and the TCF of the surface acoustic wave devices 1 including the dielectric layers 20 having different thicknesses were measured. The measurement results of the reflection coefficients are indicated by a solid line in a graph shown in FIG. 4. The measurement results of the TCF are illustrated in FIG. 5.

Conditions in Example 1

Figure 3:
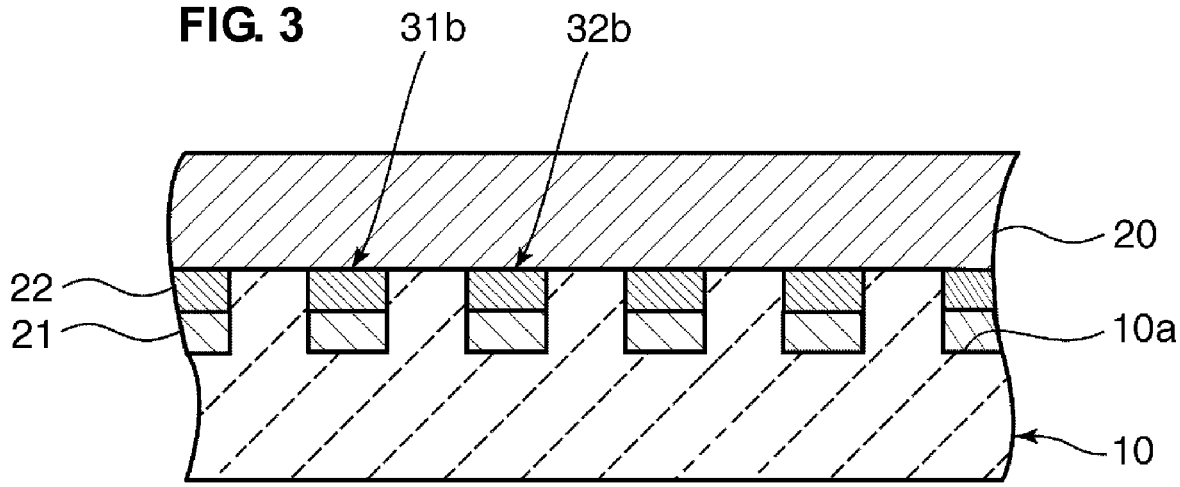
FIG. 3 is a schematic cross-sectional view of a surface acoustic wave device according to Comparative Examples 1 to 4.

Piezoelectric component 10: LiTaO₃ substrate defined by Euler angles (0°, 128°, 0°)
Thickness (mm) of piezoelectric component 10: 0.38
First electrode layer 21: Pt film
Wavelength-normalized thickness (h/λ) of first electrode layer 21: 0.03
Second electrode layer 22: Al film
Wavelength-normalized thickness (h/λ) of second electrode layer 22: 0.04
Dielectric layer 20: SiO₂ layer In Comparative Example 1, surface acoustic wave devices as illustrated in FIG. 3 were produced under the same conditions as those in Example 1, except that both the first and second electrode layers 21 and 22 were formed in the grooves 10a of the piezoelectric component 10. The reflection coefficients of the surface acoustic wave devices including the dielectric layers 20 having different thicknesses were measured. The measurement results of the reflection coefficients are indicated by a broken line in a graph shown in FIG. 4.

In Example 2, the surface acoustic wave devices 1 illustrated in FIGS. 1 and 2 were produced under conditions described below. The reflection coefficients and the TCF of the surface acoustic wave devices 1 including the dielectric layers 20 having different thicknesses were measured. The measurement results of the reflection coefficients are indicated by a solid line in a graph shown in FIG. 6. The measurement results of the TCF are illustrated in FIG. 7.

Conditions in Example 2

Piezoelectric component 10: LiTaO$_3$ substrate defined by Euler angles (0°, 216°, 0°)
Thickness (mm) of piezoelectric component 10: 0.38
First electrode layer 21: Pt film
Wavelength-normalized thickness (h/λ) of first electrode layer 21: 0.03
Second electrode layer 22: Al film
Wavelength-normalized thickness (h/λ) of second electrode layer 22: 0.04
Dielectric layer 20: SiO$_2$ layer In Comparative Example 2, surface acoustic wave devices as illustrated in FIG. 3 were produced under the same conditions as those in Example 2, except that both the first and second electrode layers 21 and 22 were formed in the grooves 10*a* of the piezoelectric component 10. The reflection coefficients of the surface acoustic wave devices including the dielectric layers 20 having different thicknesses were measured. The measurement results of the reflection coefficients are indicated by a broken line in a graph shown in FIG. 6.

Figure 4:
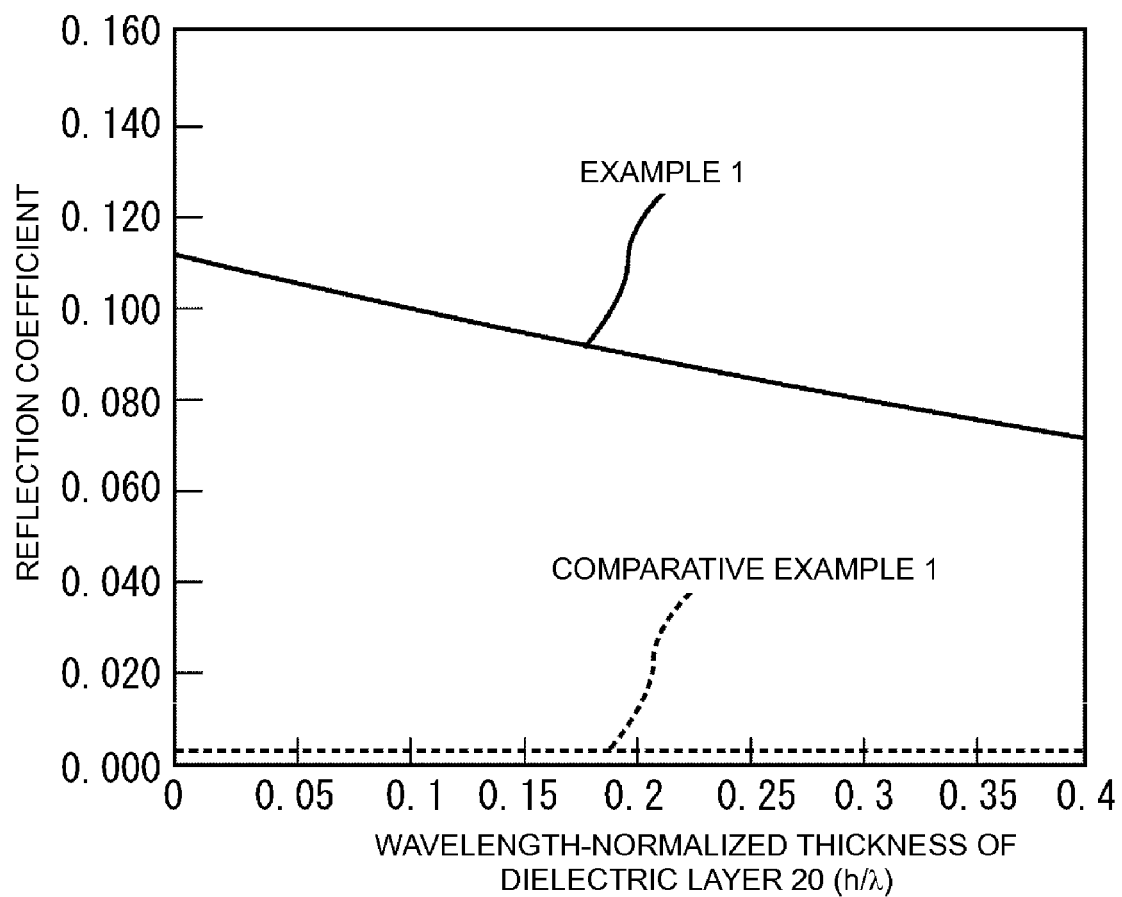
FIG. 4 is a graph illustrating reflection coefficients in Example 1 and Comparative Example 1.
Figure 5:
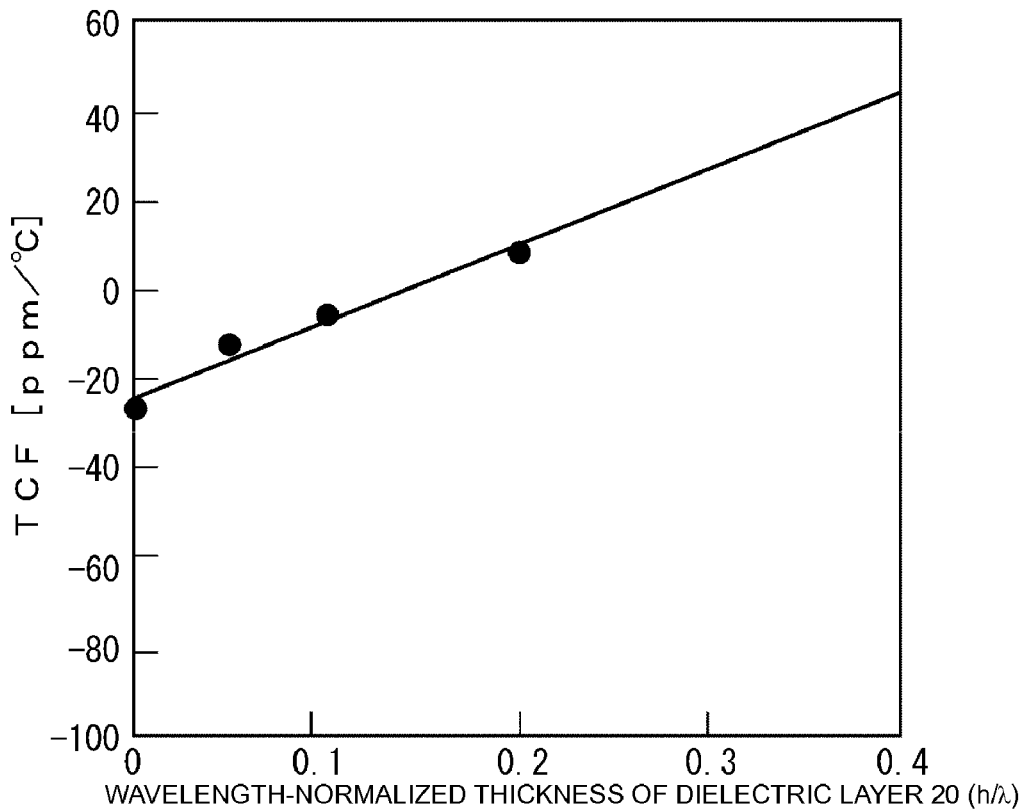
FIG. 5 is a graph illustrating TCF in Example 1 and Comparative Example 1.
Figure 6:
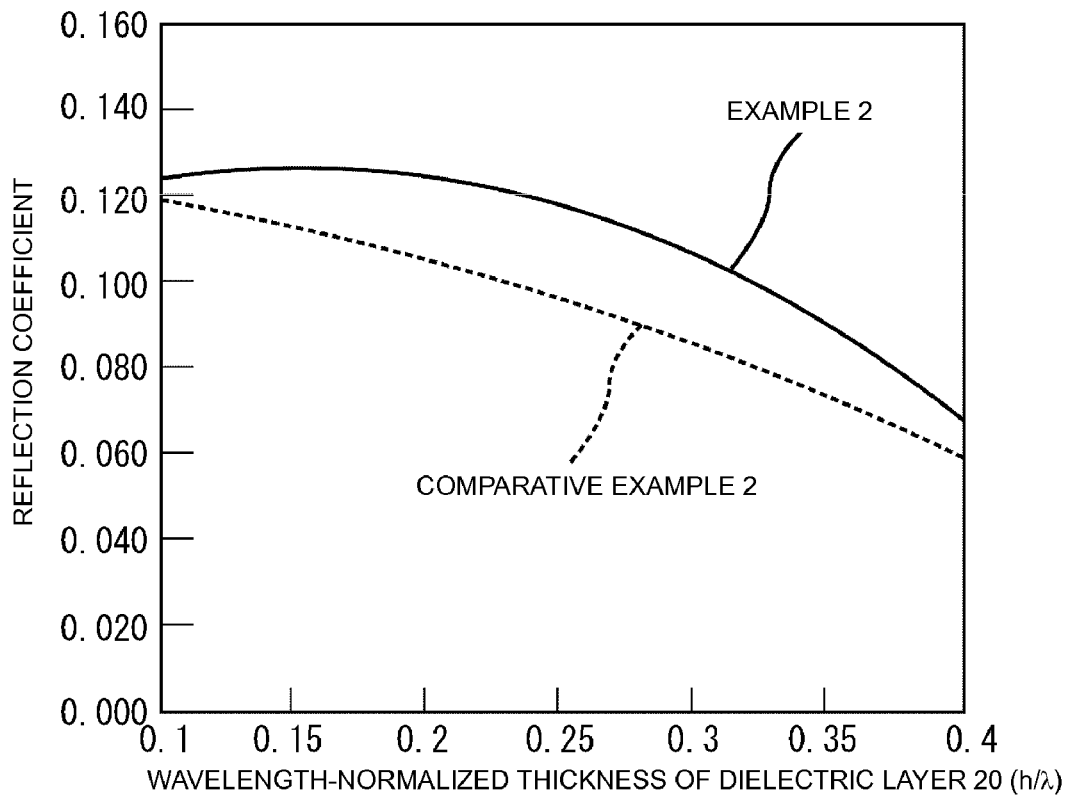
FIG. 6 is a graph illustrating the reflection coefficients in Example 2 and Comparative Example 2.
Figure 7:
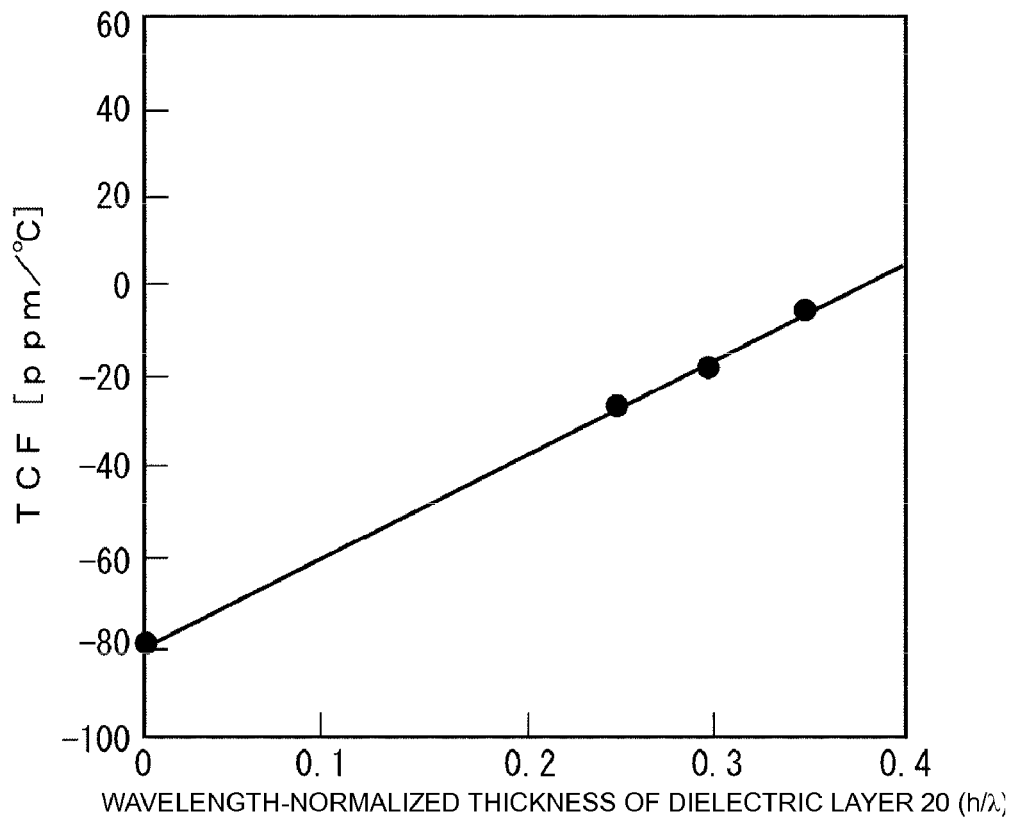
FIG. 7 is a graph illustrating TCF in Example 2 and Comparative Example 2.

As illustrated in FIGS. 4 and 6, the reflection coefficients in Examples 1 and 2, in which the first electrode layers 21 were formed in the grooves 10*a* and in which the second electrode layers 22 were formed above the tops of the grooves 10*a*, were higher than those in Comparative Examples 1 and 2 in which both the first and second electrode layers 21 and 22 were formed in the grooves 10*a*. The results demonstrate that the formation of the first electrode layers 21 in the grooves 10*a* and the formation of the second electrode layers 22 above the tops of the grooves 10*a* result in a high reflection coefficient.

FIGS. 5 and 7 demonstrate that the formation of the dielectric layer 20 improves the TCF and that an increase in the thickness of the dielectric layer 20 results in a reduction in TCF.

EXAMPLES 3 AND 4 AND COMPARATIVE EXAMPLES 3 AND 4

Figure 8:
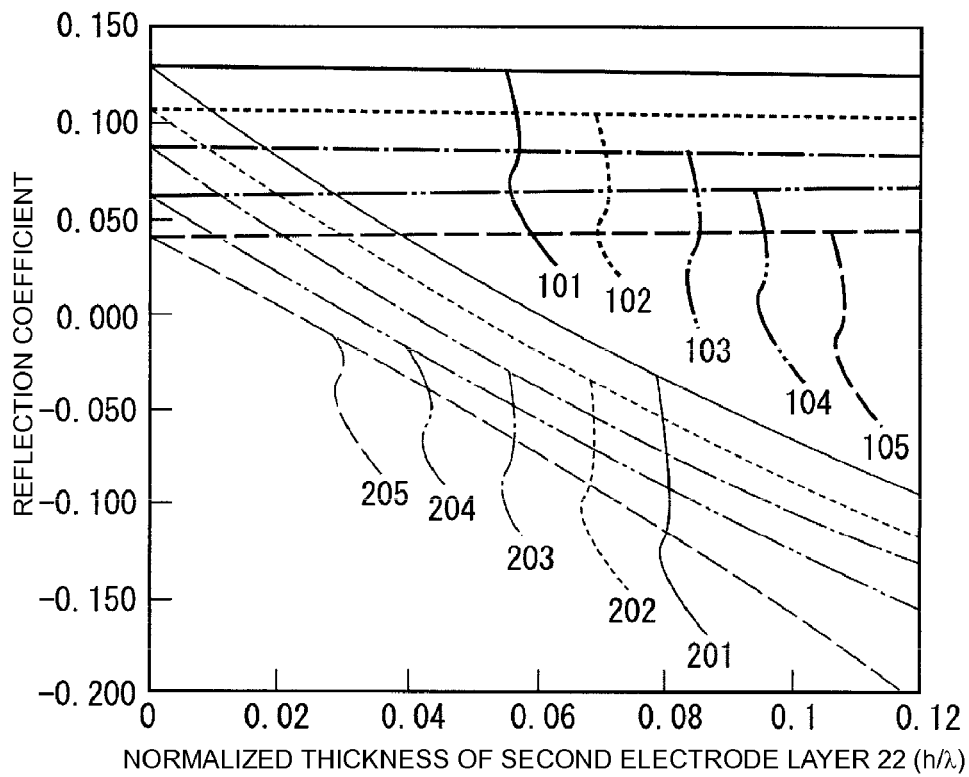
FIG. 8 is a graph illustrating the reflection coefficients in Example 3 and Comparative Example 3.
Figure 9:
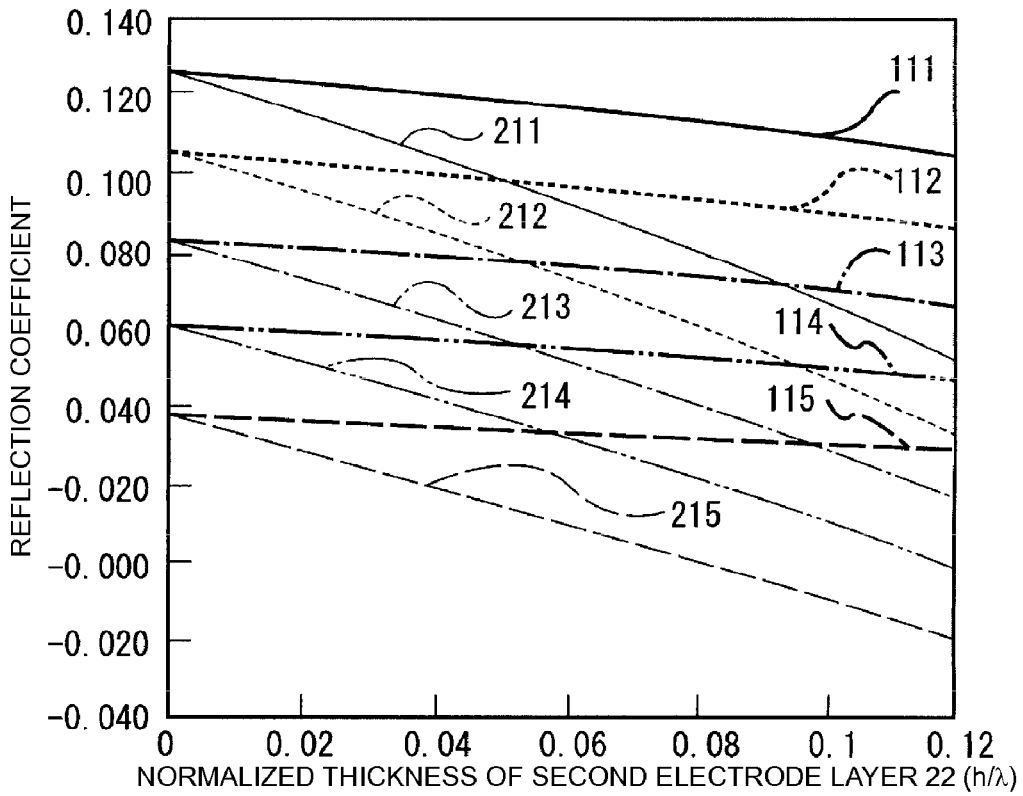
FIG. 9 is a graph illustrating the reflection coefficients in Example 4 and Comparative Example 4.

In Examples 3 and 4, the surface acoustic wave devices 1 illustrated in FIGS. 1 and 2 were produced under conditions described below. The reflection coefficients of and the phase velocities in the surface acoustic wave devices 1 including the second electrode layers 22 having different wavelength-normalized thicknesses (h/λ) were measured. The measurement results of the reflection coefficients are illustrated in FIGS. 8 and 9. The measurement results of the phase velocities are illustrated in FIGS. 10 and 11.

Figure 10:
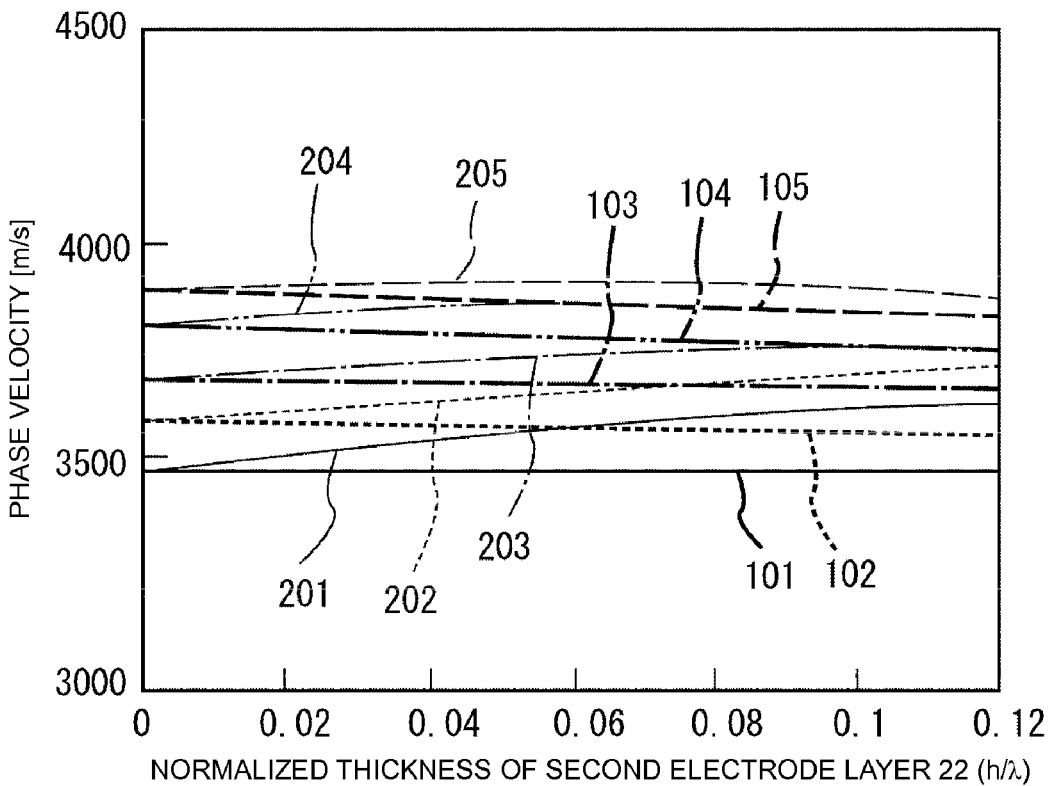
FIG. 10 is a graph illustrating phase velocities in Example 3 and Comparative Example 3.

Specifically, in Example 3, graphs labeled 101 in FIGS. 8 and 10 are data when the wavelength-normalized thickness (h/λ) of the first electrode layers 21 is 0.05. In Example 3, graphs labeled 102 in FIGS. 8 and 10 are data when the wavelength-normalized thickness (h/λ) of the first electrode layers 21 is 0.04. In Example 3, graphs labeled 103 in FIGS. 8 and 10 are data when the wavelength-normalized thickness (h/λ) of the first electrode layers 21 is 0.03. In Example 3, graphs labeled 104 in FIGS. 8 and 10 are data when the wavelength-normalized thickness (h/λ) of the first electrode layers 21 is 0.02. In Example 3, graphs labeled 105 in FIGS. 8 and 10 are data when the wavelength-normalized thickness (h/λ) of the first electrode layers 21 is 0.01.

Figure 11:
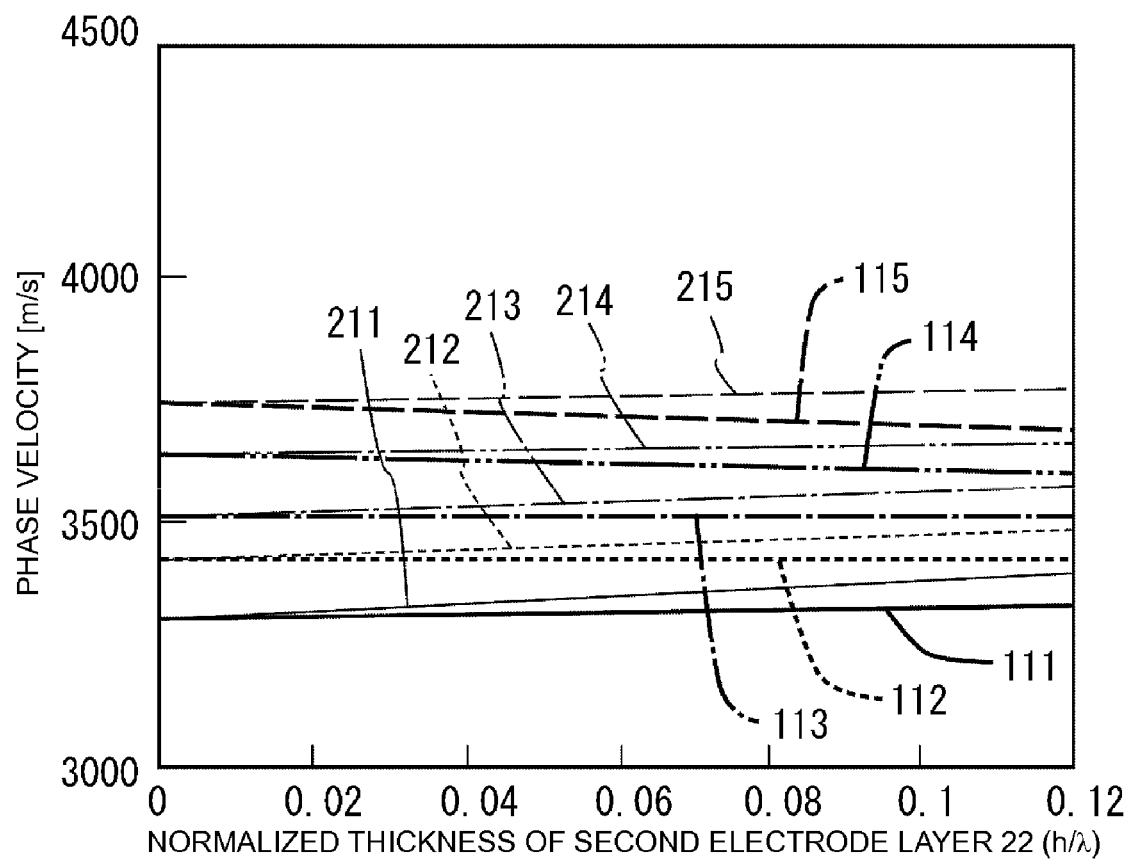
FIG. 11 is a graph illustrating phase velocities in Example 4 and Comparative Example 4.

In Example 4, graphs labeled 111 in FIGS. 9 and 11 are data when the wavelength-normalized thickness (h/λ) of the first electrode layers 21 is 0.05. In Example 4, graphs labeled 112 in FIGS. 9 and 11 are data when the wavelength-normalized thickness (h/λ) of the first electrode layers 21 is 0.04. In Example 4, graphs labeled 113 in FIGS. 9 and 11 are data when the wavelength-normalized thickness (h/λ) of the first electrode layers 21 is 0.03. In Example 4, graphs labeled 114 in FIGS. 9 and 11 are data when the wavelength-normalized thickness (h/λ) of the first electrode layers 21 is 0.02. In Example 4, graphs labeled 115 in FIGS. 9 and 11 are data when the wavelength-normalized thickness (h/λ) of the first electrode layers 21 is 0.01.

Conditions in Example 3

Piezoelectric component 10: LiTaO$_3$ substrate defined by Euler angles (0°, 128°, 0°)
Thickness (mm) of piezoelectric component 10: 0.38
First electrode layer 21: Pt film
Second electrode layer 22: Al film
Dielectric layer 20: SiO$_2$ layer
Wavelength-normalized thickness (h/λ) of dielectric layer 20: 0.25

Conditions in Example 4

Piezoelectric component 10: LiTaO$_3$ substrate defined by Euler angles (0°, 216°, 0°)
Thickness (mm) of piezoelectric component 10: 0.38
First electrode layer 21: Pt film
Second electrode layer 22: Al film
Dielectric layer 20: SiO$_2$ layer
Wavelength-normalized thickness (h/λ) of dielectric layer 20: 0.25

In Comparative Example 3, surface acoustic wave devices as illustrated in FIG. 3 were produced under the same conditions as those in Example 3, except that both the first and second electrode layers 21 and 22 were formed in the grooves 10*a* of the piezoelectric component 10. The reflection coefficients of and the phase velocities in the surface acoustic wave devices including the second electrode layers 22 having different thicknesses were measured. The measurement results of the reflection coefficients are illustrated in FIG. 8. The measurement results of the phase velocities are illustrated in FIG. 10.

Specifically, in Comparative Example 3, graphs labeled 201 in FIGS. 8 and 10 are data when the wavelength-normalized thickness (h/λ) of the first electrode layers 21 is 0.05. In Comparative Example 3, graphs labeled 202 in FIGS. 8 and 10 are data when the wavelength-normalized thickness (h/λ) of the first electrode layers 21 is 0.04. In Comparative Example 3, graphs labeled 203 in FIGS. 8 and 10 are data when the wavelength-normalized thickness (h/λ) of the first electrode layers 21 is 0.03. In Comparative Example 3, graphs labeled 204 in FIGS. 8 and 10 are data when the wavelength-normalized thickness (h/λ) of the first electrode layers 21 is 0.02. In Comparative Example 3, graphs labeled 205 in FIGS. 8 and 10 are data when the wavelength-normalized thickness (h/λ) of the first electrode layers 21 is 0.01.

In Comparative Example 4, surface acoustic wave devices as illustrated in FIG. 3 were produced under the same conditions as those in Example 4, except that both the first and second electrode layers 21 and 22 were formed in the grooves 10*a* of the piezoelectric component 10. The reflection coefficients of and the phase velocities in the surface acoustic wave devices including the second electrode layers 22 having different thicknesses were measured. The measurement results of the reflection coefficients are illustrated in FIG. 9. The measurement results of the phase velocities are illustrated in FIG. 11.

Specifically, in Comparative Example 4, graphs labeled 211 in FIGS. 9 and 11 are data when the wavelength-normalized thickness (h/λ) of the first electrode layers 21 is 0.05. In Comparative Example 4, graphs labeled 212 in FIGS. 9 and 11 are data when the wavelength-normalized thickness (h/λ) of the first electrode layers 21 is 0.04. In Comparative Example 4, graphs labeled 213 in FIGS. 9 and 11 are data when the wavelength-normalized thickness (h/λ) of the first electrode layers 21 is 0.03. In Comparative Example 4, graphs labeled 214 in FIGS. 9 and 11 are data when the wavelength-normalized thickness (h/λ) of the first electrode layers 21 is 0.02. In Comparative Example 4, graphs labeled 215 in FIGS. 9 and 11 are data when the wavelength-normalized thickness (h/λ) of the first electrode layers 21 is 0.01.

FIGS. 8 and 9 demonstrate that in Comparative Examples 3 and 4 (graphs 201 to 205 and 211 to 215), in which both the first and second electrode layers 21 and 22 are formed in the grooves 10a, the reflection coefficients are markedly reduced as the thickness of each second electrode layer 22 is increased. In contrast, it was discovered that in Examples 3 and 4 (graphs 101 to 105 and 111 to 115), in which the first electrode layers 21 are formed in the grooves 10a and in which the second electrode layers 22 are formed above the tops of the grooves 10a, the reflection coefficients are not markedly reduced even if the second electrode layers 22 have an increased thickness. These results demonstrate that for the surface acoustic wave device having the first electrode layers 21 formed in the grooves 10a and having the second electrode layers 22 formed above the tops of the grooves 10a, an increase in the thickness of the second electrode layers 22 allows the resistance of the first and second electrode fingers 31b and 32b to be reduced while a reduction in reflection coefficient is prevented. This strikes a balance between a high reflection coefficient and a high acoustic velocity.

FIGS. 10 and 11 demonstrate that there is substantially no change in the phase velocity of the surface acoustic wave even if the thickness of the second electrode layers 22 are changed, regardless of whether the second electrode layers 22 are located in the grooves 10a. That is, it was discovered that an increase in the thickness of the second electrode layers 22 allows the resistance of the first and second electrode fingers 31b and 32b to be reduced while a reduction in acoustic velocity is prevented. The results demonstrate that even in the case where the second electrode layers 22 are formed in the grooves 10a, it is possible to strike a balance between a high acoustic velocity and a low insertion loss.

COMPARATIVE EXAMPLES 5 TO 8

Figure 12:
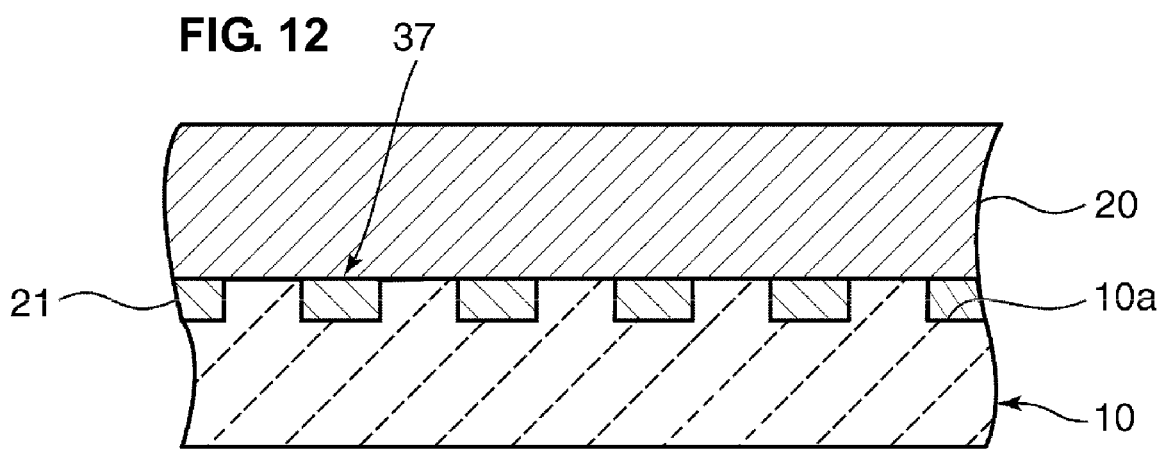
FIG. 12 is a schematic cross-sectional view of a surface acoustic wave device in Comparative Examples 5 and 7.
Figure 13:
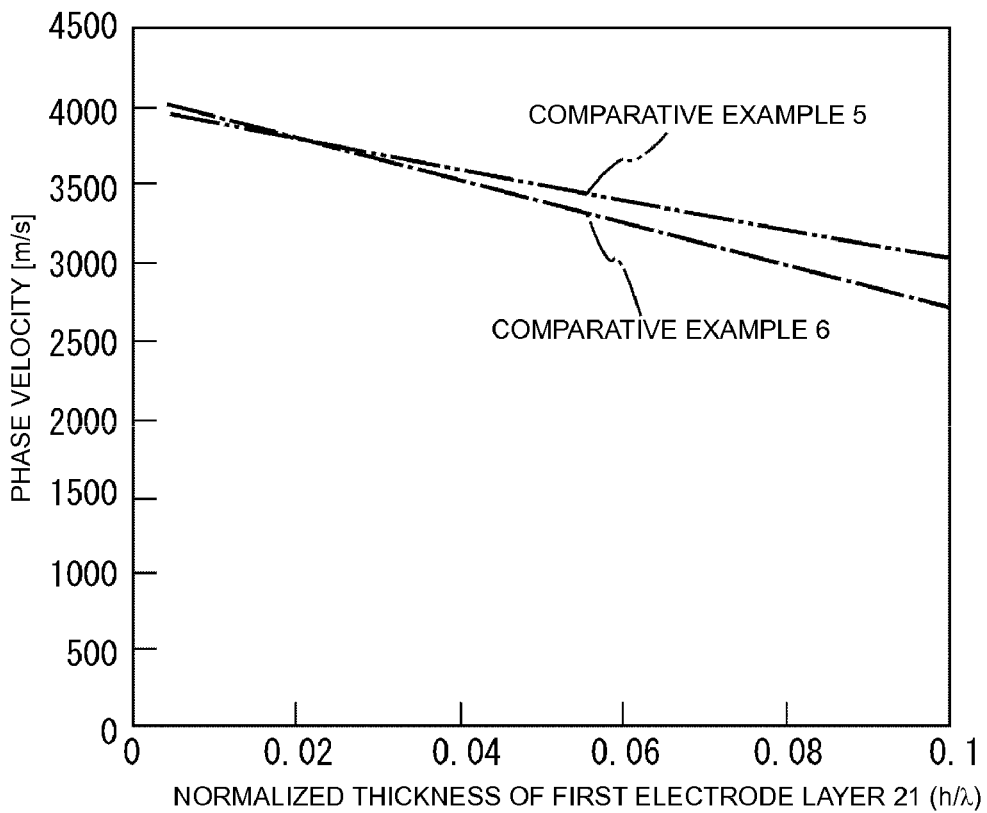
FIG. 13 is a graph illustrating phase velocities in Comparative Examples 5 and 6.

In Comparative Example 5, surface acoustic wave devices as illustrated in FIG. 12 were produced in which the IDT electrodes 37 including only the first electrode layers 21 that were constituted by Pt films was formed in the grooves 10a of the piezoelectric component 10 formed of a LiTaO$_3$ substrate defined by the Euler angles (0°, 128°, 0°) and in which the dielectric layer 20, composed of SiO$_2$, having a wavelength-normalized thickness (h/λ) of 0.25 was formed so as to cover the IDT electrodes 37. The phase velocities in the resulting surface acoustic wave devices including the first electrode layers 21 having different thicknesses were measured. FIG. 13 illustrates the results.

In Comparative Example 6, surface acoustic wave devices were produced under the same conditions as those in Comparative Example 5, except that the dielectric layer 20 was not formed. The phase velocity was measured for each of the first electrode layers 21 having different thicknesses. FIG. 13 illustrates the results.

Figure 14:
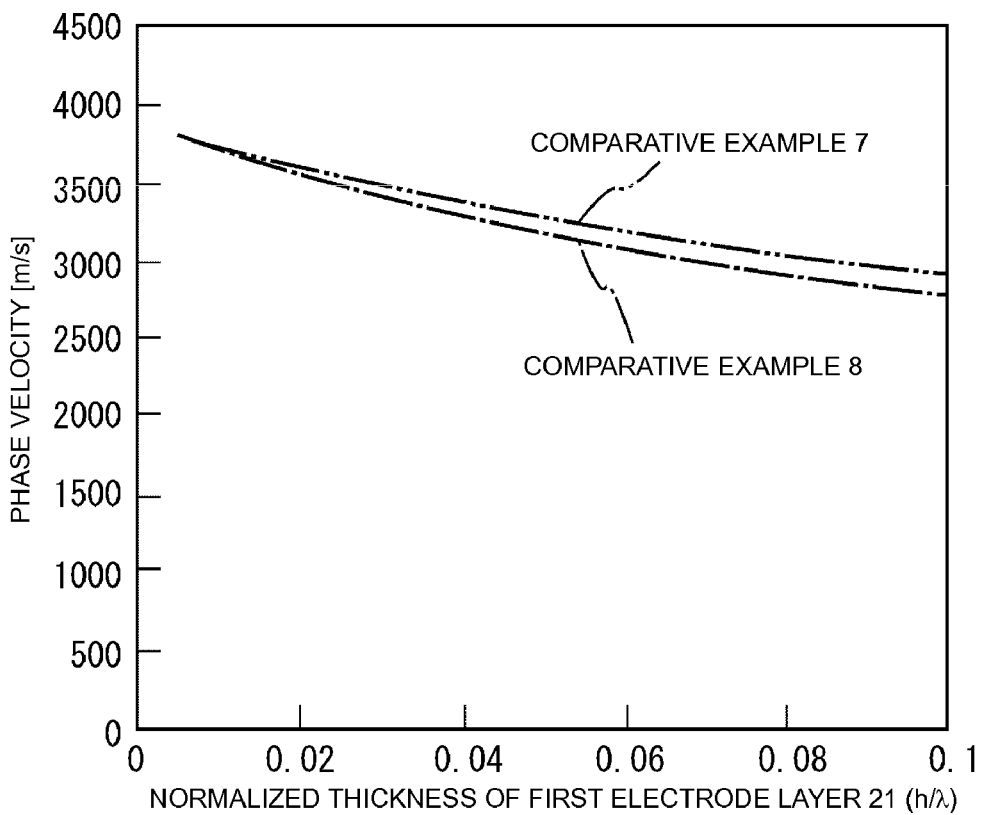
FIG. 14 is a graph illustrating phase velocities in Comparative Examples 7 and 8.

In Comparative Example 7, surface acoustic wave devices were produced under the same conditions as those in Comparative Example 5, except that the piezoelectric component 10 was formed of a LiNbO$_3$ substrate defined by the Euler angles (0°, 216°, 0°). The phase velocity was measured for each of the first electrode layers 21 having different thicknesses. FIG. 14 illustrates the results.

In Comparative Example 8, surface acoustic wave devices were produced under the same conditions as those in Comparative Example 6, except that the piezoelectric component 10 was formed of a LiNbO$_3$ substrate defined by the Euler angles (0°, 216°, 0°). The phase velocity was measured for each of the first electrode layers 21 having different thicknesses. FIG. 14 illustrates the results.

The results illustrated in FIGS. 13 and 14 demonstrate that in the case where the second electrode layers 22 are not formed, the phase velocity of a surface acoustic wave is markedly reduced as the thickness of each first electrode layer 21 is increased. Thus, in the case where the second electrode layers 22 are not formed, it was discovered that a reduction in the resistance of each of the electrode fingers 31b and 32b and an increase in acoustic velocity are less likely to be achieved.

EXAMPLES 5 AND 6 AND COMPARATIVE EXAMPLES 9 AND 10

In Example 5, the surface acoustic wave devices 1 were produced under the same conditions as those in Example 1. The electromechanical coupling coefficients ($k^2$) of the surface acoustic wave devices 1 including the dielectric layers 20 having different thicknesses were measured.

Figure 15:
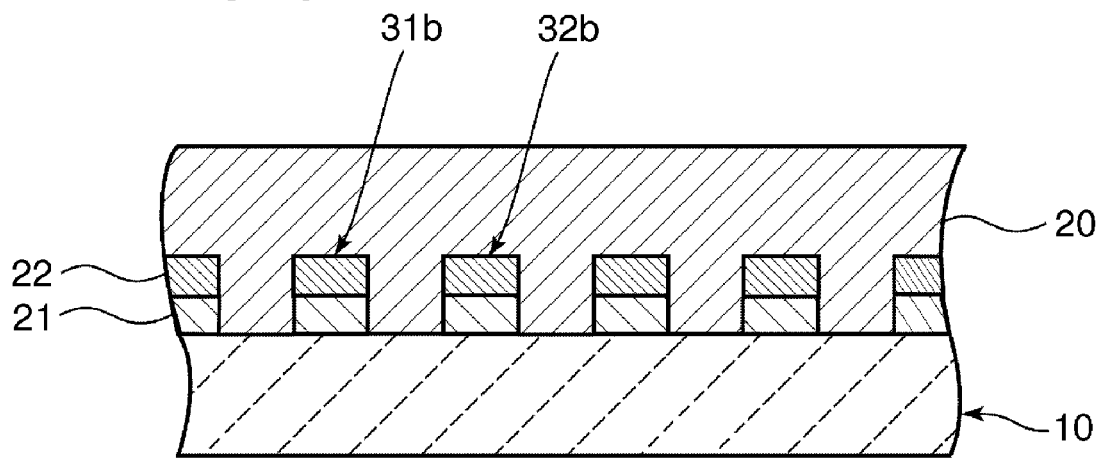
FIG. 15 is a schematic cross-sectional view of a surface acoustic wave device in Comparative Examples 9 and 10.
Figure 16:
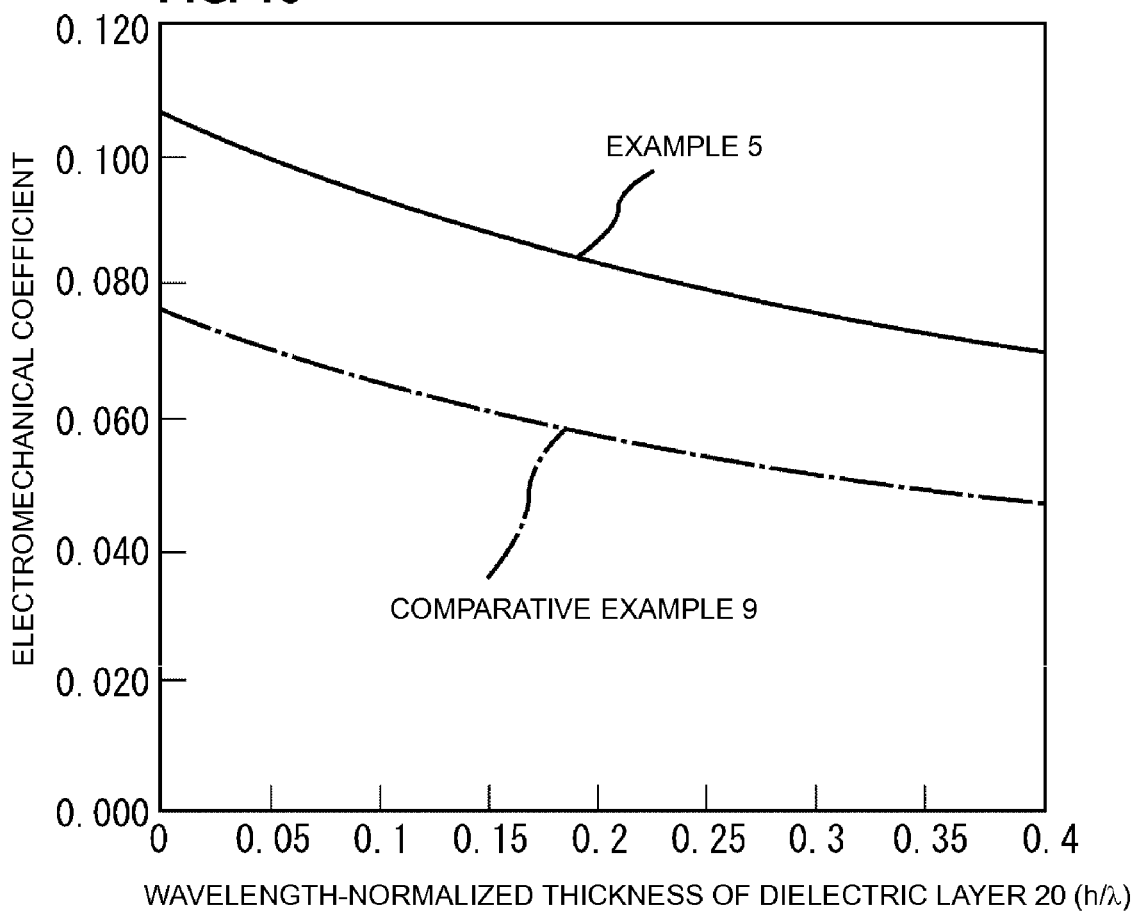
FIG. 16 is a graph illustrating electromechanical coupling coefficients in Example 5 and Comparative Example 9.

In Comparative Example 9, surface acoustic wave devices as illustrated in FIG. 15 were produced under the same conditions as those in Example 5, except that the both the first and second electrode layers 21 and 22 were formed on the piezoelectric component 10. The electromechanical coupling coefficient ($k^2$) of the surface acoustic wave devices including the dielectric layers 20 having different thicknesses were measured. FIG. 16 illustrates the results in Example 5 and Comparative Example 9.

In Example 6, the surface acoustic wave devices 1 were produced under the same conditions as those in Example 2. The electromechanical coupling coefficients ($k^2$) of the surface acoustic wave devices 1 including the dielectric layers 20 having different thicknesses were measured.

Figure 17:
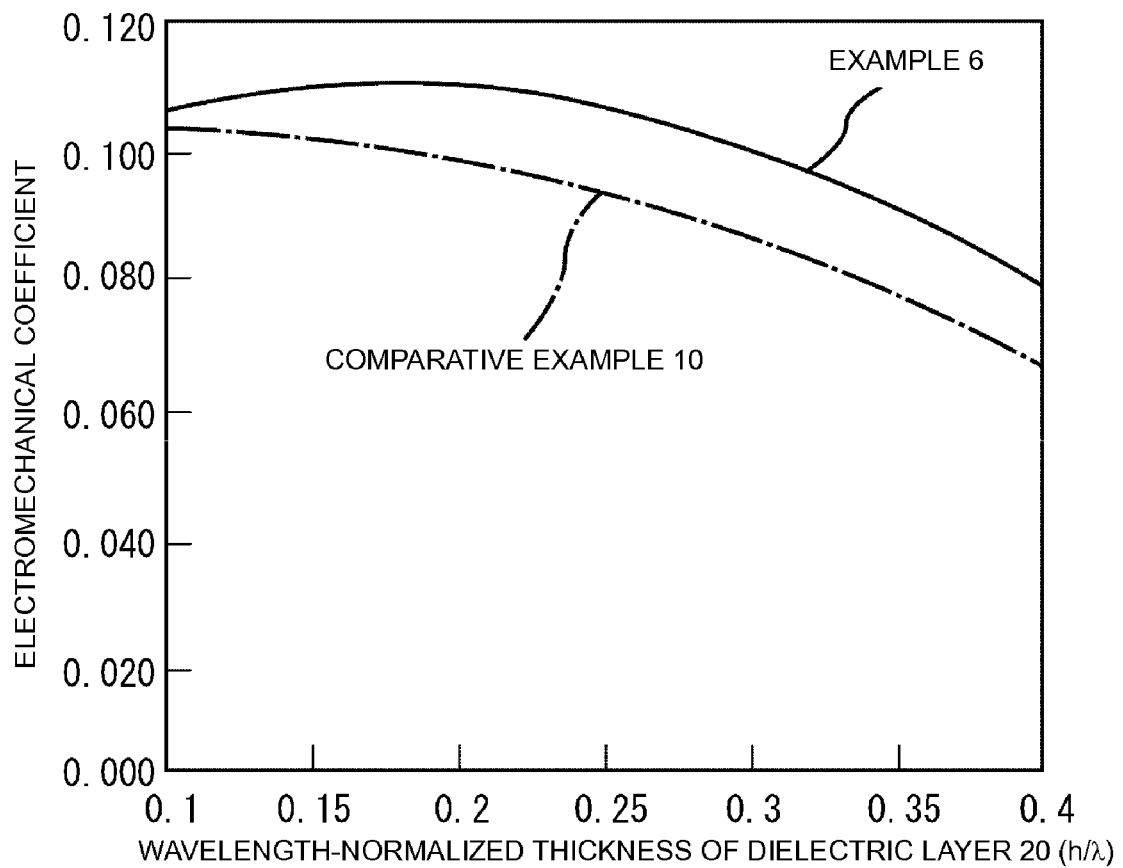
FIG. 17 is a graph illustrating electromechanical coupling coefficients in Example 6 and Comparative Example 10.

In Comparative Example 10, surface acoustic wave devices as illustrated in FIG. 15 were produced under the same conditions as those in Example 6, except that the both the first and second electrode layers 21 and 22 were formed on the piezoelectric component 10. The electromechanical coupling coefficient (k2) of the surface acoustic wave devices including the dielectric layers 20 having different thicknesses were measured. FIG. 17 illustrates the results in Example 6 and Comparative Example 10.

As illustrated in FIGS. 16 and 17, it was discovered that the electromechanical coupling coefficients ($k^2$) in Examples 5 and 6, in which the second electrode layers 22 were formed in the grooves 10a, were higher than those in Comparative Examples 9 and 10, in which both the first and second electrode layers 21 and 22 were formed on the piezoelectric component 10, regardless of the thickness of the dielectric layer 20.

EXAMPLE 7

Figure 18:
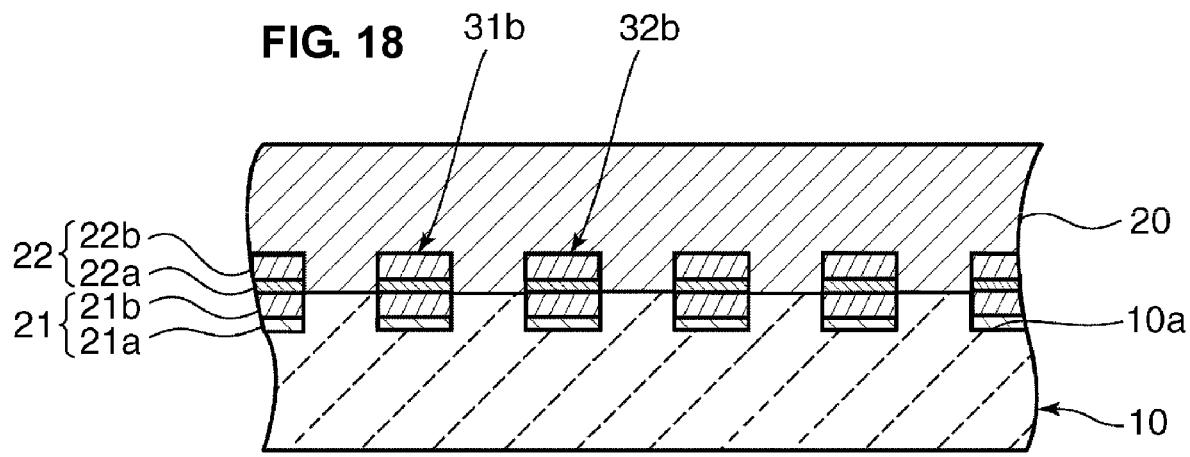
FIG. 18 is a schematic cross-sectional view of a surface acoustic wave device in Example 7.
Figure 19:
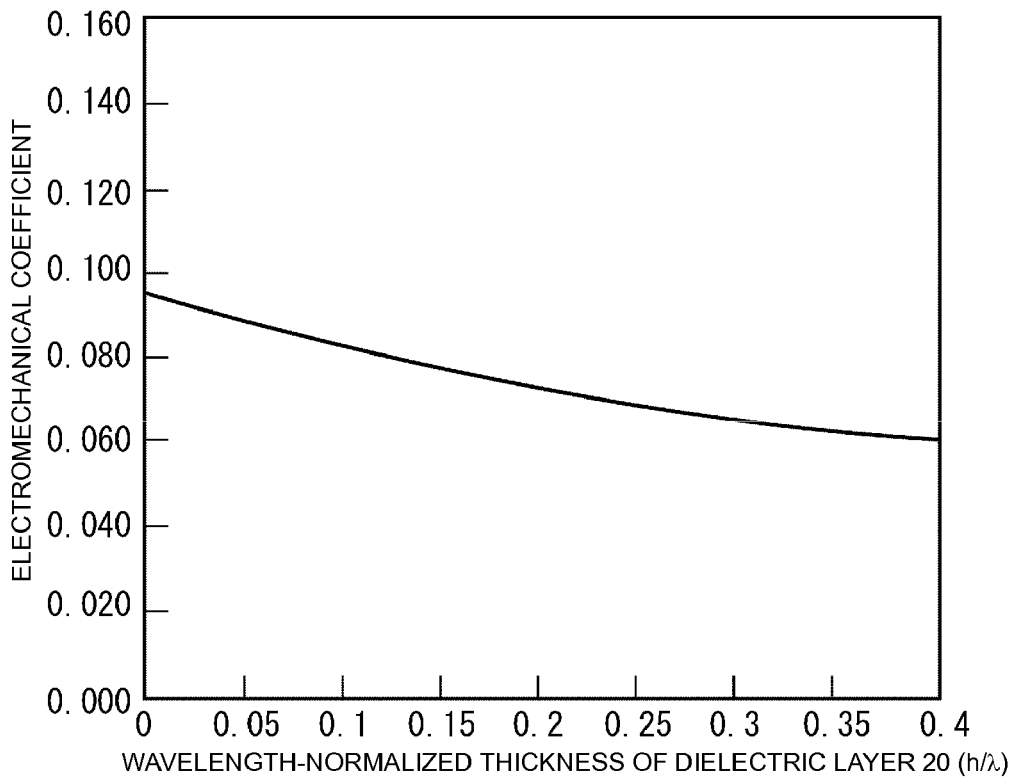
FIG. 19 is a graph illustrating an electromechanical coupling coefficient in Example 7.
Figure 20:
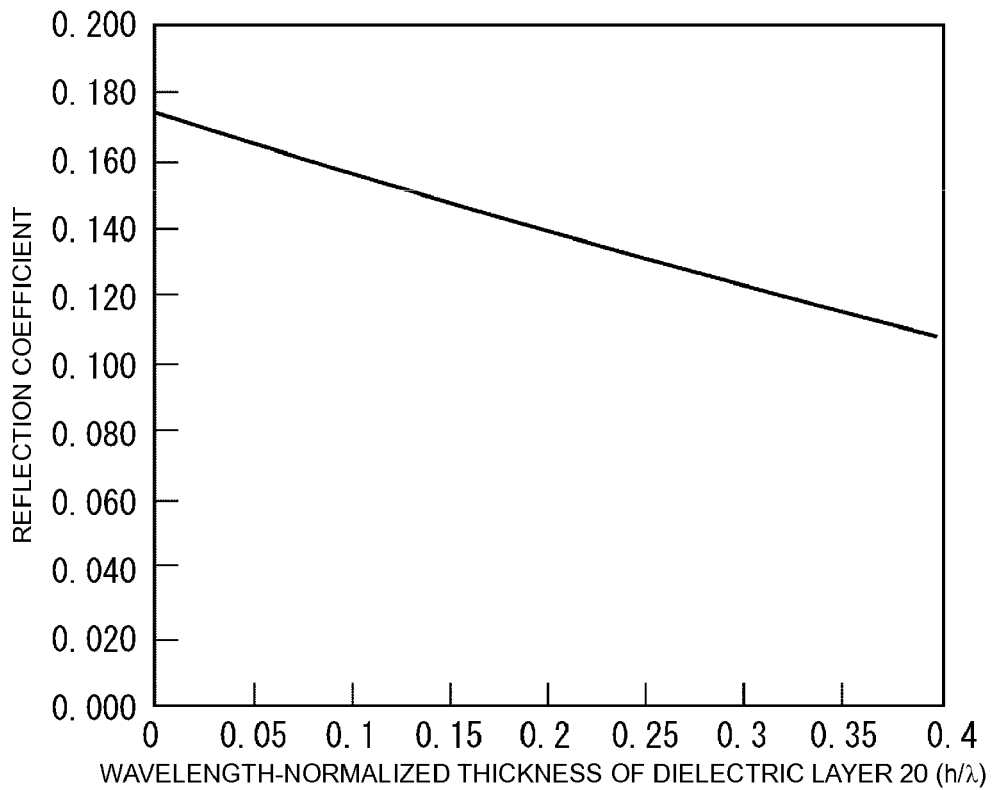
FIG. 20 is a graph illustrating a reflection coefficient in Example 7.

As illustrated in FIG. 18, surface acoustic wave devices in which each of the first electrode layers 21 included a first metal film 21a and a second metal film 21b and in which each of the second electrode layers 22 included a first metal film 22a and a second metal film 22b were produced under conditions described below. The electromechanical coupling coefficient ($k^2$) and the reflection coefficients were measured for each of the dielectric layers 20 having different thicknesses. FIGS. 19 and 20 illustrate the measurement results of the electromechanical coupling coefficient ($k^2$) and the reflection coefficients, respectively.

Conditions in Example 7

Piezoelectric component 10: $LiTaO_3$ substrate defined by Euler angles (0°, 128°, 0°)
First metal film 21a: Ti film
Wavelength-normalized thickness (h/λ) of first metal film 21a: 0.01
Second metal film 21b: Pt film
Wavelength-normalized thickness (h/λ) of second metal film 21b: 0.02
First metal film 22a: Ti film
Wavelength-normalized thickness (h/λ) of first metal film 22a: 0.02
Second metal film 22b: Cu film
Wavelength-normalized thickness (h/λ) of second metal film 22b: 0.04
Dielectric layer 20: $SiO_2$ layer
Mean density ($\rho_a$) of first electrode layer 21: $1.58 \times 10^4$ kg/m³
Mean stiffness ($C44_a$) of first electrode layer 21: $5.54 \times 10^{10}$ N/m²
$(\rho_a^3 \times C44_a)^{1/2}$ of first electrode layer 21: $4.66 \times 10^{11}$
Mean density ($\rho_b$) of second electrode layer 22: $7.46 \times 10^3$ kg/m³
Mean stiffness ($C44_b$) of second electrode layer 22: $4.98 \times 10^{10}$ N/m²
$(\rho_b^3 \times C44_b)^{1/2}$ of second electrode layer 22: $1.44 \times 10^{11}$ Thus, $(\rho_a^3 \times C44_a)^{1/2} = (4.66 \times 10^{11})$ of the first electrode layers 21 is set to a value higher than $(\rho_b^3 \times C44_b)^{1/2} (=1.44 \times 10^{11})$ of the second electrode layers 22.

FIGS. 19 and 20 demonstrate that even in the case where each of the first and second electrode layers 21 and 22 includes the plurality of metal films, high electromechanical coupling coefficients ($k^2$) and high reflection coefficients are obtained.

EXAMPLES 8 AND 9

Figure 21:
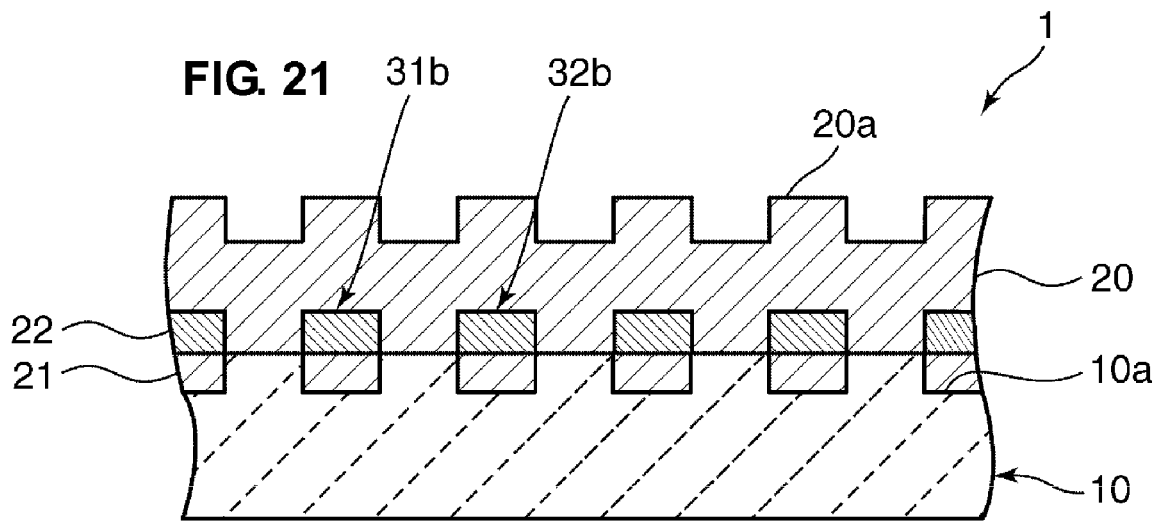
FIG. 21 is a schematic cross-sectional view of a surface acoustic wave device in Examples 8 and 9.
Figure 22:
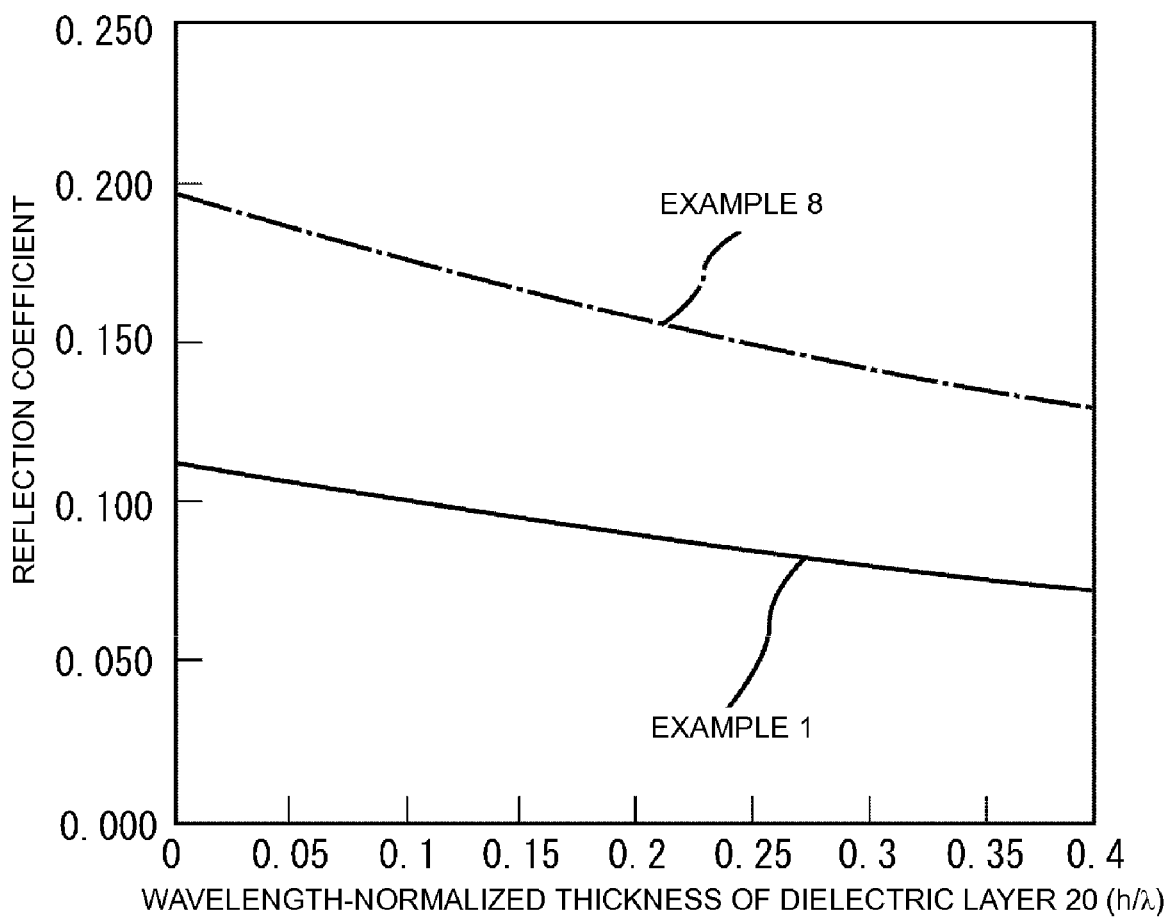
FIG. 22 is a graph illustrating reflection coefficients in Examples 1 and 8.

In Example 8, surface acoustic wave devices as illustrated in FIG. 21 were produced under the same conditions as those in Example 1, except that the surface 20a of each dielectric layer 20 opposite the surface adjacent to a corresponding one of the piezoelectric components 10 had an uneven shape corresponding to the shapes of the electrode fingers 31b and 32b. Then the reflection coefficients were measured. FIG. 22 illustrates the measurement results of the reflection coefficients together with the results in Example 1.

Figure 23:
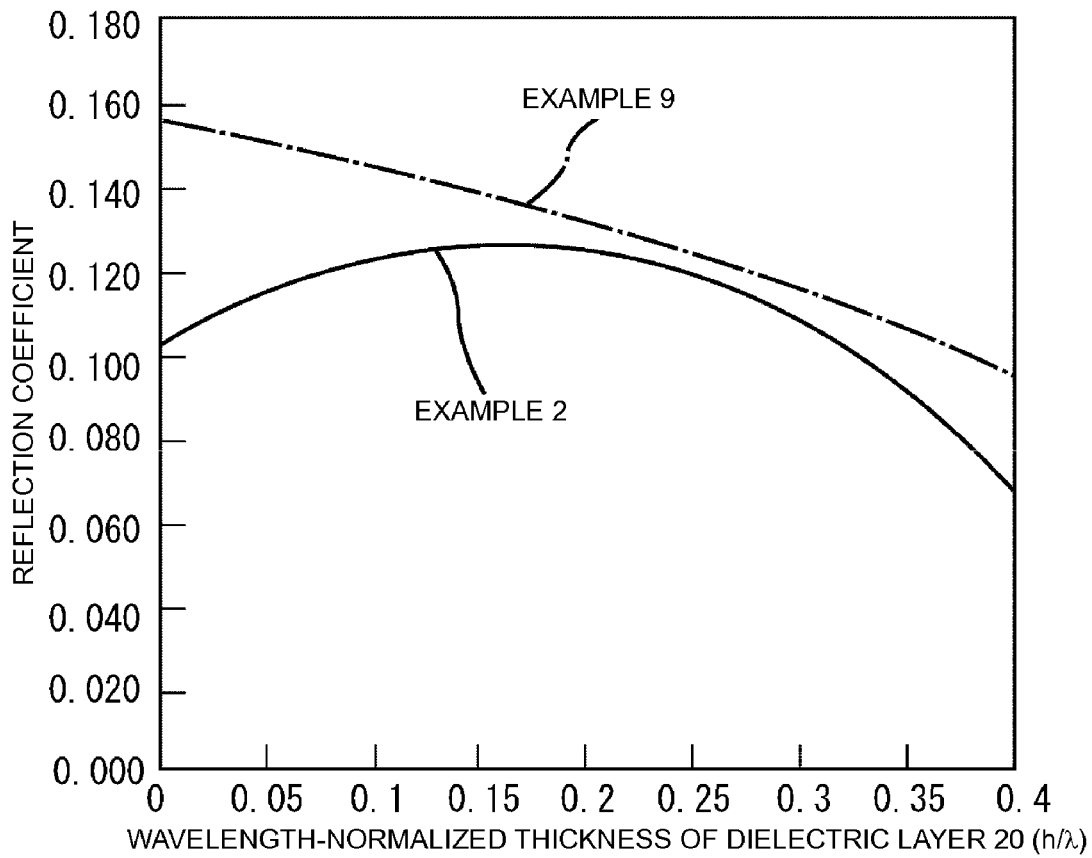
FIG. 23 is a graph illustrating reflection coefficients in Examples 2 and 9.

In Example 9, surface acoustic wave devices as illustrated in FIG. 21 were produced under the same conditions as those in Example 2, except that the surface of each dielectric layer 20 opposite the surface adjacent to a corresponding one of the piezoelectric components 10 had an uneven shape corresponding to the shapes of the electrode fingers 31b and 32b. Then the reflection coefficients were measured. FIG. 23 illustrates the measurement results of the reflection coefficients together with the results in Example 2.

FIGS. 22 and 23 demonstrate that in the case where the surface of the dielectric layer 20 opposite the surface adjacent to the piezoelectric component 10 has the uneven shape corresponding to the shapes of the electrode fingers 31b and 32b, higher reflection coefficients are obtained.

Preferred Embodiment of Boundary Acoustic Wave Device

Figure 24:
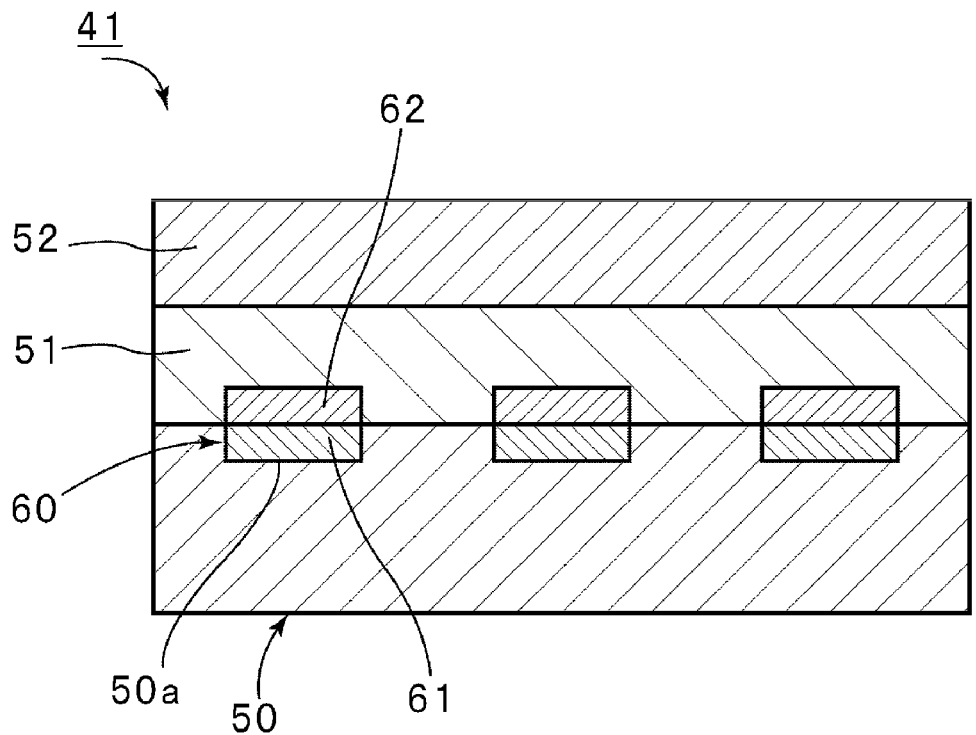
FIG. 24 is a schematic front cross-sectional view of a boundary acoustic wave device according to a preferred embodiment of the present invention.

In the foregoing preferred embodiments and Examples 1 to 9, surface acoustic wave devices using surface acoustic waves have been described. An elastic wave device according to a preferred embodiment of the present invention may be a boundary acoustic wave device using a boundary acoustic wave. FIG. 24 is a schematic front cross-sectional view of a portion of a boundary acoustic wave device where IDT electrodes are provided, according to a second preferred embodiment of the present invention.

A boundary acoustic wave device 41 includes a piezoelectric component 50. Grooves 50a are formed in the upper surface of the piezoelectric component 50. A first dielectric layer 51 is stacked so as to cover the piezoelectric component 50. Furthermore, a second dielectric layer 52 composed of a dielectric material different in acoustic velocity from the first dielectric layer 51 is stacked on the first dielectric layer 51.

The piezoelectric component 50 is composed of a piezoelectric single crystal of $LiNbO_3$, $LiTaO_3$, or the like. In this preferred embodiment, 15° Y cut X SAW propagation $LiNbO_3$, i.e., $LiNbO_3$ defined by the Euler angles (0°, 105°, 0°), is preferably used, for example.

The grooves 50a are preferably formed in the same way as the grooves 10a of the surface acoustic wave device illustrated in FIG. 1.

IDT electrodes 60 are arranged at the interface between the piezoelectric component 50 and the first dielectric layer 51. The IDT electrodes 60 include first electrode layers 61 and second electrode layers 62 each stacked on corresponding one of the first electrode layers 61.

The first electrode layers 61 are disposed in the grooves 50a. The upper surface of each of the first electrode layers 61 is flush with the upper surface of the piezoelectric component 50.

In this preferred embodiment, the first dielectric layer 51 is composed of $SiO_2$, and the second dielectric layer 52 is composed of SiN. Each of the dielectric layers 51 and 52 may be composed of another dielectric material. To confine a boundary acoustic wave to the interface between the piezoelectric component 50 and the first dielectric layer 51, an acoustic velocity in the second dielectric layer 52 preferably is to be higher than that in the first dielectric layer 51. Thus, in this preferred embodiment, the first dielectric layer 51 is composed of $SiO_2$, and the second dielectric layer 52 is composed of SiN, which is a relatively high acoustic-velocity material.

However, dielectric materials constituting the first and second dielectric layers 51 and 52 are not limited thereto.

$SiO_2$ is preferably used as a material constituting the first dielectric layer 51 because the temperature characteristics can be improved. In this case, the second dielectric layer is preferably composed of SiN.

In this preferred embodiment, the first and second electrode layers 61 and 62 are composed of metal materials that are the same as those of the first and second electrode layers 21 and 22 of the surface acoustic wave device according to the foregoing preferred embodiment as illustrated in FIG. 1. That is, the one-half power of the product of the cube of the mean density $\rho_a$ and the mean stiffness ($C44_a$) of the first electrode layers, i.e., $(\rho_a^3 \times C44_a)^{1/2}$, is preferably set to a value greater than the one-half power of the product of the cube of the mean density ($\rho_b$) and the mean stiffness ($C44_b$) of the second electrode layers, i.e., $(\rho_b^3 \times C44_b)^{1/2}$. This results in an increased electromechanical coupling coefficient ($k^2$) also in the boundary acoustic wave device 41, thereby achieving a wider band width and increasing the reflection coefficient. Furthermore, the resistance of each of the first and second electrode fingers can be reduced, thereby increasing the acoustic velocity of a boundary acoustic wave. This makes it possible to increase the pitch of the electrode fingers. In other words, it is possible to increase the frequency without reducing the pitch of the electrode fingers, thereby increasing the resistance to static electricity and suppressing the occurrence of a ripple due to a transverse mode.

Preferably, $(\rho_a^3 \times C44_a)^{1/2} > 1.95 \times 10^{11} > (\rho_b^3 \times C44_b)^{1/2}$ is satisfied. In this case, it is possible to further increase the electromechanical coupling coefficient, further reduce the insertion loss, and further enhance the acoustic velocity of a boundary acoustic wave.

Experimental examples serving as specific examples of the second preferred embodiment of the present invention will be described below. Similarly to the foregoing examples of preferred embodiments of the surface acoustic wave devices, in the following experimental examples, one-port elastic wave resonators each including IDT electrodes and reflectors were produced.

First Experimental Example

The boundary acoustic wave devices 41 illustrated in FIG. 24 were produced under conditions described below. The reflection coefficients and the electromechanical coupling coefficients of the boundary acoustic wave devices were measured.

Figure 25:
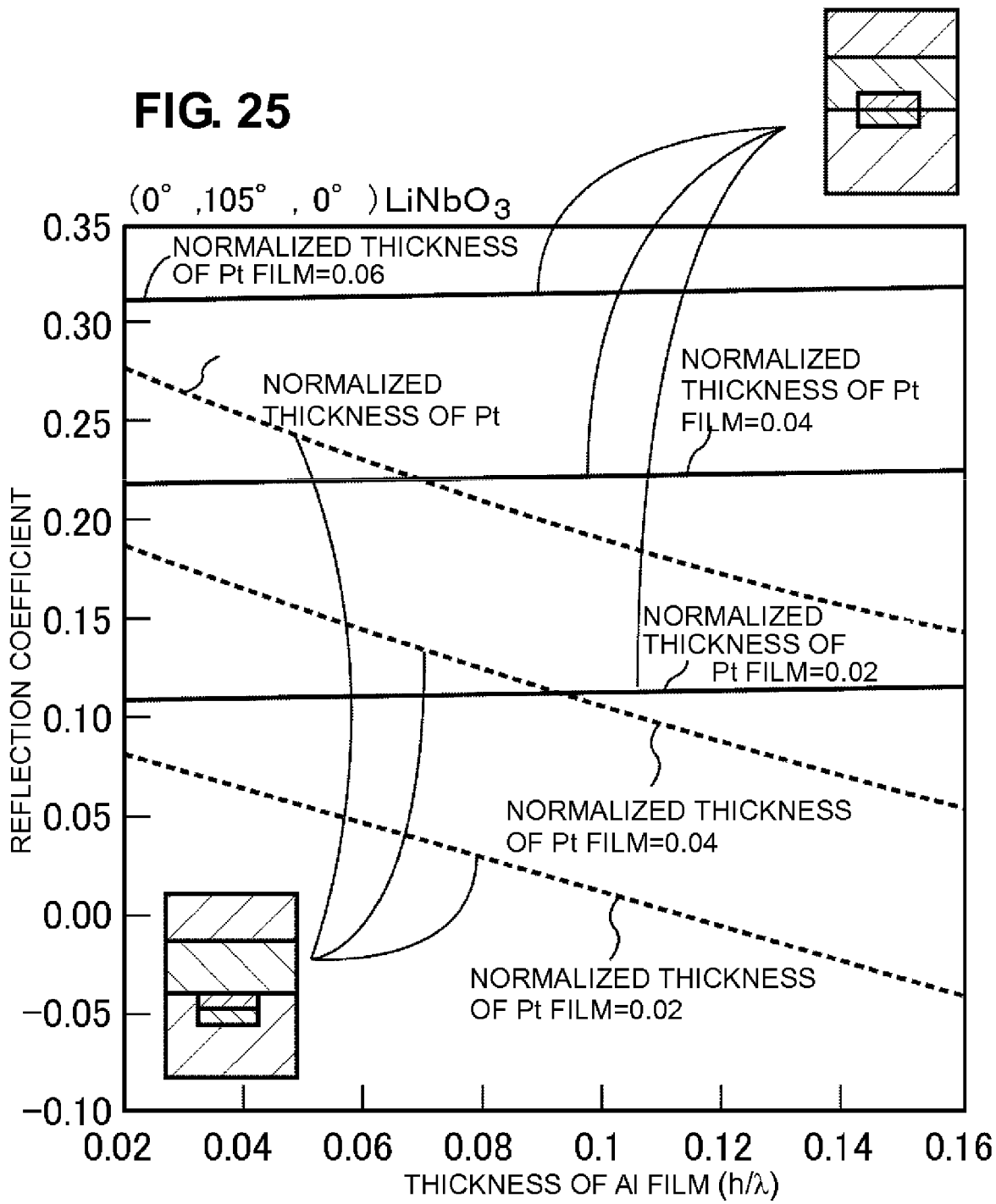
FIG. 25 illustrates the relationships between the thicknesses of Al films and the reflection coefficients of boundary acoustic wave devices according to a preferred embodiment of the present invention and a comparative example in a first experimental example.
Figure 26:
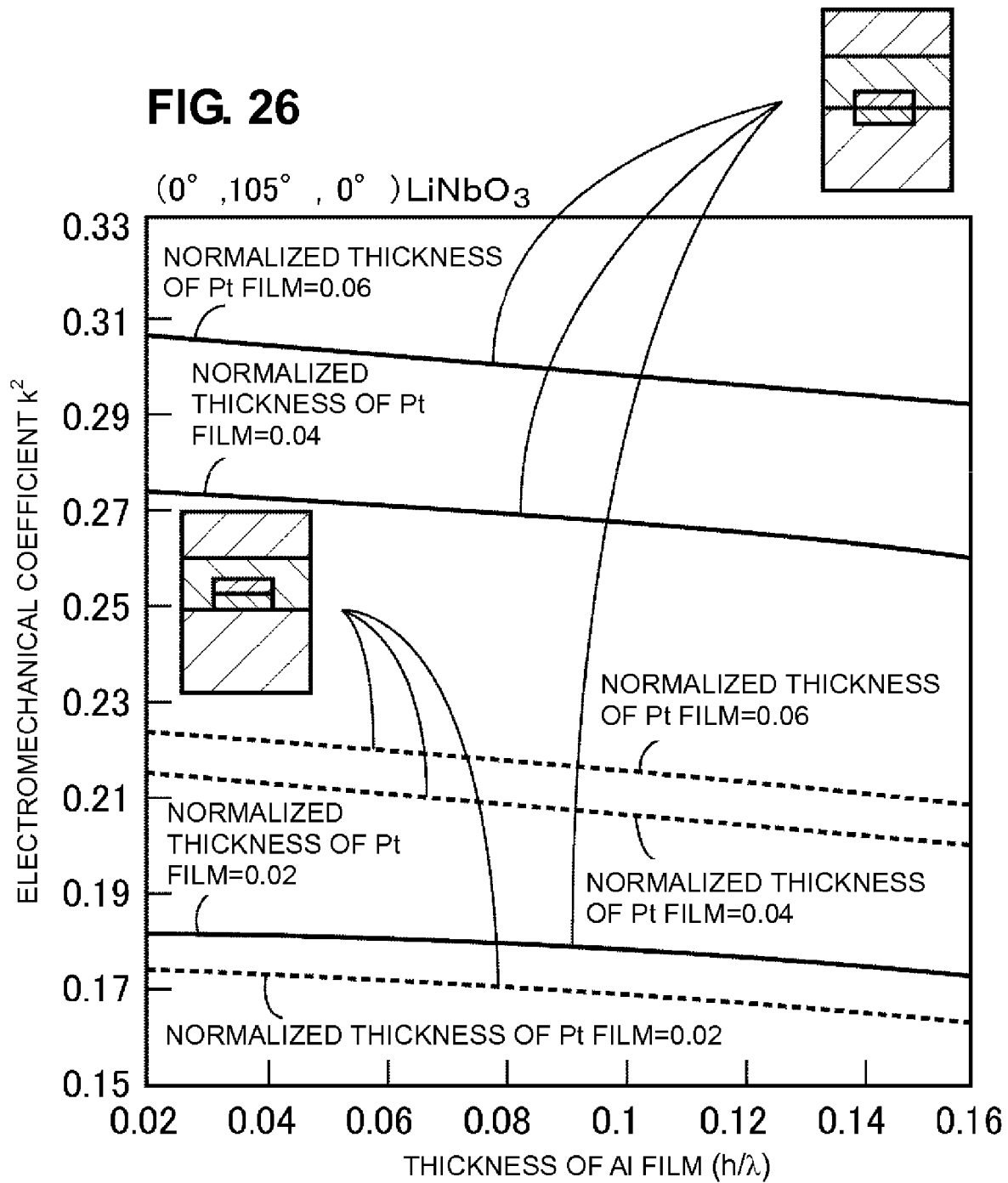
FIG. 26 illustrates the relationships between the thicknesses of the Al films and the electromechanical coupling coefficients k$^2$ of the boundary acoustic wave devices according to a preferred embodiment of the present invention and the comparative example in the first experimental example.
Figure 27:
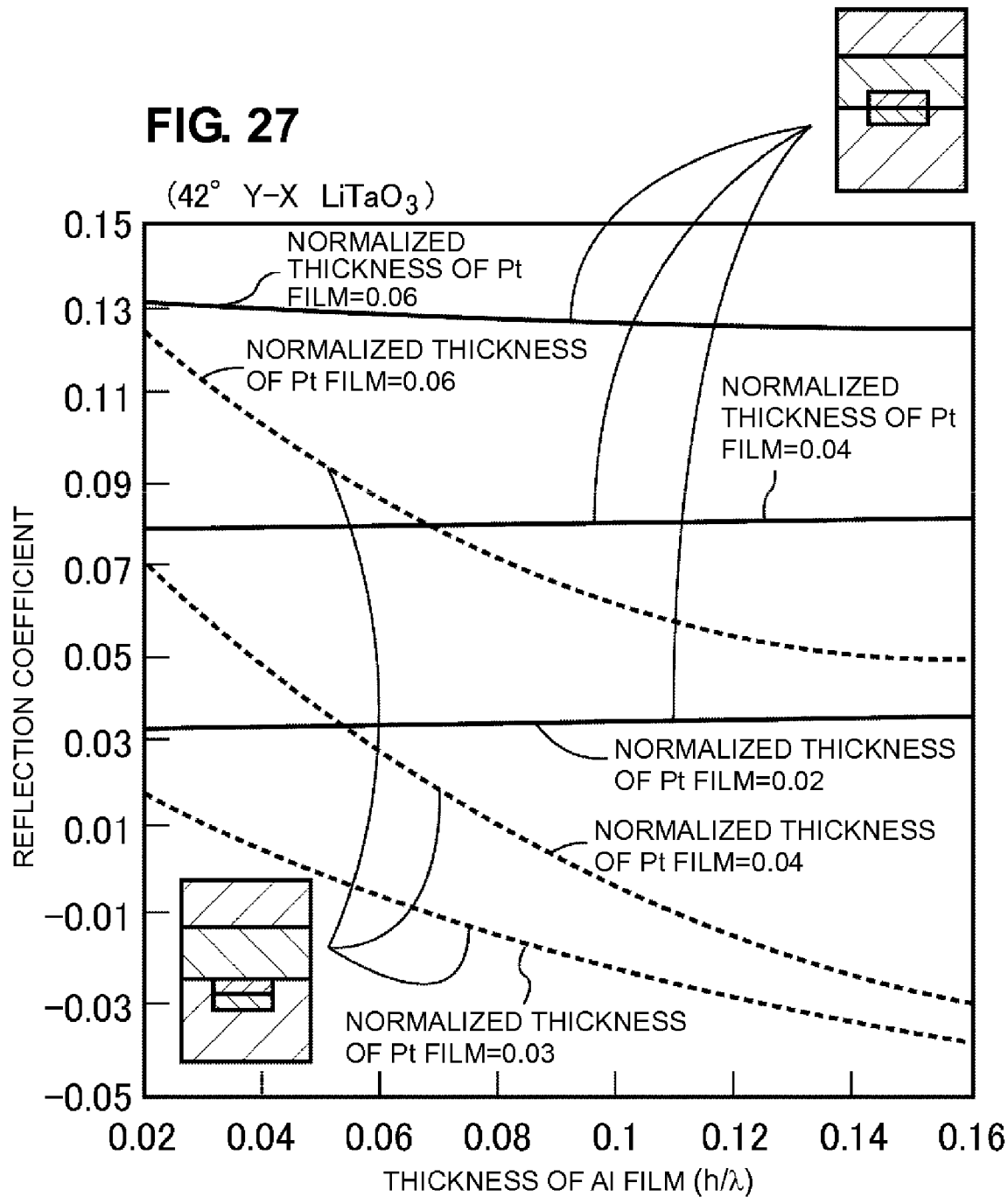
FIG. 27 illustrates the relationships between the thicknesses of Al films and the reflection coefficients of boundary acoustic wave devices according to a preferred embodiment of the present invention and a comparative example in a second experimental example.
Figure 28:
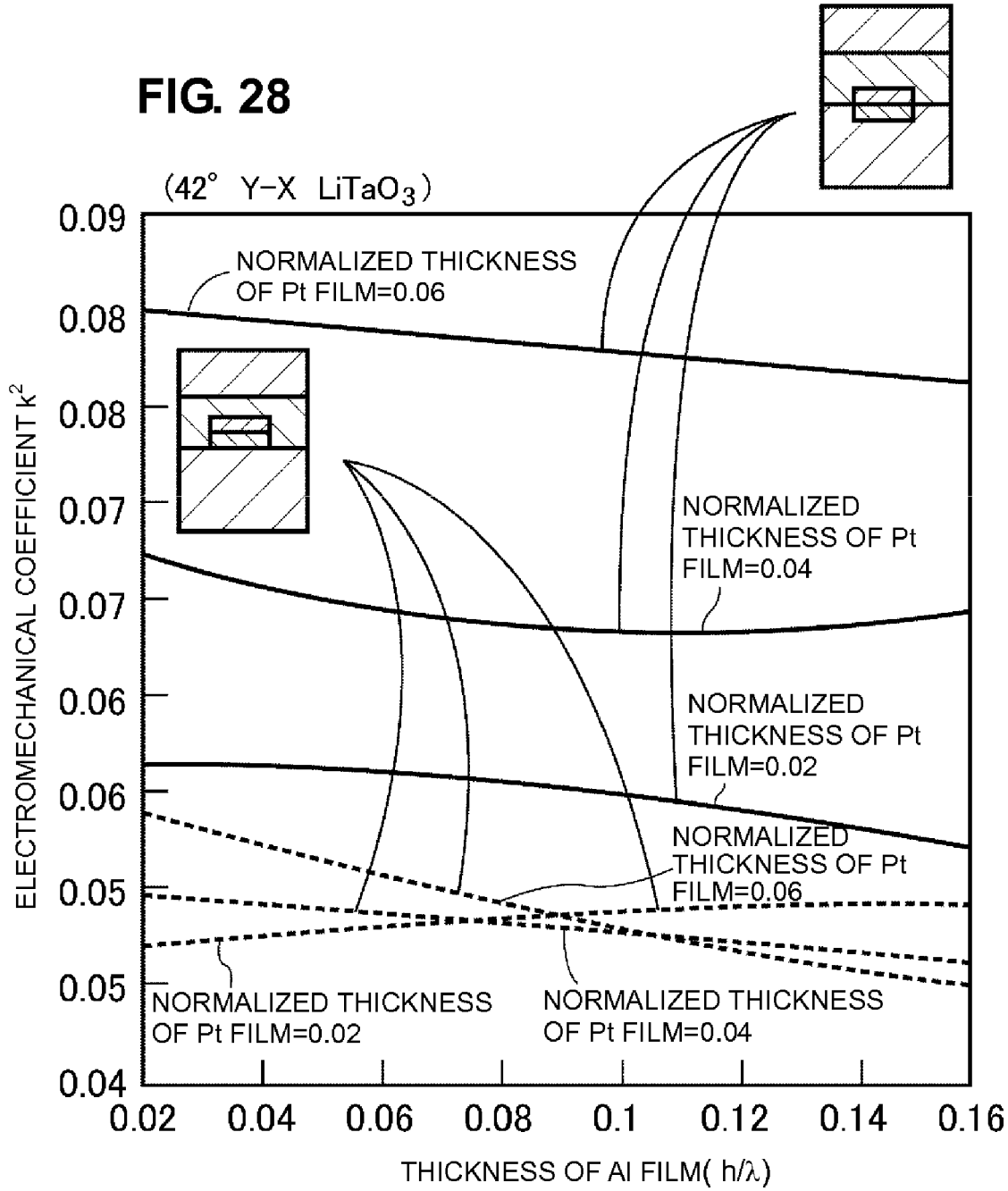
FIG. 28 illustrates the relationships between the thicknesses of the Al films and the electromechanical coupling coefficients k$^2$ of the boundary acoustic wave devices according to a preferred embodiment of the present invention and the comparative example in the second experimental example.

FIGS. 25 and 27 illustrate the measurement results of the reflection coefficients. FIGS. 26 and 28 illustrate the measurement results of the electromechanical coupling coefficients.

Piezoelectric component 50: $LiNbO_3$ substrate defined by Euler angles (0°, 105°, 0°)
First electrode layer 61: Pt film
Wavelength-normalized thickness (h/λ) of first electrode layers 61: 0.02, 0.04, or 0.06
Second electrode layer 62: Al film
Wavelength-normalized thickness (h/λ) of second electrode layers 62: 0.02 to 0.16
First dielectric layer 51: $SiO_2$ layer
Thickness of first dielectric layer 51: λ, which is equal to 1 in terms of normalized thickness
Second dielectric layer: SiN film
Thickness of second dielectric layer 52: 2λ, which is equal to 2 in terms of normalized thickness In a comparative example, boundary acoustic wave devices were produced as in the foregoing preferred embodiment, except that each of the grooves had a depth that was sufficient to allow the entire electrode including the first and second electrode layers to be embedded therein, i.e., the upper surface of each IDT electrode was flush with the upper surface of a corresponding one of the piezoelectric components 50. In FIG. 25, solid lines and broken lines indicate the relationships between the thicknesses of the second electrode layers composed of Al and the reflection coefficients of the boundary acoustic wave devices according to the preferred embodiment and the comparative example.

FIG. 25 clearly shows that in the comparative example, the reflection coefficient is reduced as the thickness of the second electrode layer is increased, whereas in this preferred embodiment, the reflection coefficient is not substantially degraded even when the thickness of the second electrode layer 62 is changed in the range of about 0.02 to about 0.16, for example. The results demonstrate that a high reflection coefficient is obtained compared with the comparative example in which each IDT electrode including the laminate including the metal films is completely embedded in the piezoelectric component.

FIG. 26 illustrates the relationships between the thicknesses of the Al films and the electromechanical coupling coefficients of the boundary acoustic wave devices according to the present preferred embodiment. For comparison, broken lines indicate the relationships between the thicknesses of the Al films and the electromechanical coupling coefficients of the boundary acoustic wave devices that are similarly produced, except that each IDT electrode including the laminate including the metal films is formed on the upper surface of the piezoelectric component and that no groove is formed in the upper surface of the piezoelectric component.

FIG. 26 clearly shows that in the case where the Al films having the same thickness are provided, in the present preferred embodiment, the electromechanical coupling coefficient can be increased compared with the comparative example in which each IDT electrode is not embedded in the piezoelectric component. In particular, the results demonstrate that in the case where the normalized thickness of the Al film is about 0.04 or more, the electromechanical coupling coefficient can be effectively increased.

Second Experimental Example

A plurality of boundary acoustic wave devices in which the second electrode layers composed of Al had different thicknesses were produced as in the first experimental example, except that the piezoelectric components 50 were composed of 42° Y cut X SAW propagation $LiTaO_3$. For comparison, a structure was prepared as in the present preferred embodiment, except that deep grooves were formed in the upper surface of the piezoelectric component, the grooves were filled with the electrode including the first and second electrode layers, and the upper surfaces of the Al films were flush with the upper surface of the piezoelectric component 50. The reflection coefficients of the boundary acoustic wave devices according to the present preferred embodiment and the comparative example were measured. FIG. 27 illustrates the results. In FIG. 27, solid lines indicate the results of the present preferred embodiment, and broken lines indicate the results of plural types of boundary acoustic wave devices prepared as the comparative examples.

The results demonstrate that, as with the first experimental example, also for the piezoelectric component composed of $LiTaO_3$, the reflection coefficient is not degraded even when the thickness of the Al film is increased.

In contrast, the results demonstrate that the reflection coefficient of each boundary acoustic wave device prepared as the comparative example is reduced as the thickness of the Al film is increased.

FIG. 28 illustrates the relationships between the normalized thicknesses of the Al films and the electromechanical coupling coefficients of the boundary acoustic wave devices according to the second experimental example. In FIG. 28, solid lines indicate the results of the present preferred embodiment. Broken lines indicate the results of the boundary acoustic wave devices produced as in the present preferred embodiment, except that each IDT electrode is disposed on the upper surface of the piezoelectric component and that no groove is formed in the upper surface of the piezoelectric component.

FIG. 28 clearly shows that in the case where 42° Y cut X SAW propagation LiTaO$_3$ is used, in the present preferred embodiment, the electromechanical coupling coefficient can be increased regardless of the thickness of the Al film compared with the comparative example.

It is clear from the first and second experimental examples that for the boundary acoustic wave device according to the present preferred embodiment, in the case where the thickness of the Al film is increased to reduce the resistance of the electrode fingers, the degradation in reflection coefficient is less likely to occur, a high reflection coefficient is obtained, and the electromechanical coupling coefficient $k^2$ is increased, thereby achieving a wide band width.

The piezoelectric component is not limited to the piezoelectric component with the specific cut angle. As with the surface acoustic wave device described above, in the boundary acoustic wave device according to various preferred embodiments of the present invention, piezoelectric single crystals with different cut angles may be used as the piezoelectric component.

In the first and second experimental examples, the normalized thickness of the SiO$_2$ film is preferably set to 1, and the normalized thickness of the SiN film is preferably set to 2. To improve the frequency temperature characteristics and prevent a spurious mode, these thicknesses may be appropriately changed. In such a case, according to a preferred embodiment of the present invention, it is possible to increase the electromechanical coupling coefficient while the degradation of the reflection coefficient is prevented. The acoustic velocity in SiN constituting the second dielectric layer is higher than that in SiO$_2$ constituting the first dielectric layer, so that the confinement of the boundary wave energy is not inhibited. Thus, instead of SiN, a dielectric material in which the acoustic velocity is higher than that in SiO$_2$, for example, Al$_2$O$_3$ or diamond-like carbon, may be used as a material for the second dielectric layer. Furthermore, the high acoustic velocity second dielectric layer may have a laminated structure including a plurality of dielectric films.

Moreover, in a preferred embodiment of the present invention, the second dielectric layer may not be provided. The thickness of the SiO$_2$ film serving as the first dielectric layer may be increased to concentrate the energy of a boundary acoustic wave on a portion where the electrode fingers are arranged.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. An elastic wave device comprising:
a piezoelectric component including a plurality of grooves;
at least one IDT electrode including a plurality of electrode fingers, a portion of each of the plurality of electrode fingers being located in at least one of the plurality of grooves; and
a dielectric layer arranged on the piezoelectric component so as to cover the at least one IDT electrode, the dielectric layer having a temperature coefficient of frequency, and a sign of the temperature coefficient of frequency of the dielectric layer being opposite to that of the temperature coefficient of frequency of the piezoelectric component, or the sign of the temperature coefficient of frequency of the dielectric layer being the same as that of the temperature coefficient of frequency of the piezoelectric component, and an absolute value of the temperature coefficient of frequency of the dielectric layer being smaller than that of the temperature coefficient of frequency of the piezoelectric component; wherein
each of the plurality of electrode fingers includes a first electrode layer and a second electrode layer, the first electrode layers being located in the grooves, and the second electrode layers being located on the first electrode layers and above tops of the grooves; and
a one-half power of a product of a cube of a mean density ($\rho_a$) and a mean stiffness ($C44_a$) of the first electrode layer, $(\rho_a^3 \times C44_a)^{1/2}$, is larger than a one-half power of a product of a cube of a mean density ($\rho_b$) and a mean stiffness ($C44_b$) of the second electrode layer, $(\rho_b^3 \times C44_b)^{1/2}$.

2. The elastic wave device according to claim 1, wherein the elastic wave device satisfies $(\rho_a^3 \times C44_a)^{1/2} > 1.95 \times 10^{11} > (\rho_b^3 \times C44_b)^{1/2}$.

3. The elastic wave device according to claim 1, wherein the first electrode layer is substantially made of a metal selected from a group consisting of Mo, Ta, Pt, Au, and W, or an alloy mainly containing at least one metal selected from the group.

4. The elastic wave device according to claim 1, wherein the second electrode layer is substantially made of a metal selected from a group consisting of Al, Ti, and Cu, or an alloy mainly containing at least one metal selected from the group.

5. The elastic wave device according to claim 1, wherein at least one of the first and second electrode layers includes a plurality of metal films.

6. The elastic wave device according to claim 5, wherein the second electrode layer includes a plurality of metal films, and at least one of the metal films constituting the second electrode layer is substantially made of Cr, Ni, or an alloy mainly containing at least one metal selected from Cr and Ni.

7. The elastic wave device according to claim 1, wherein the dielectric layer is a SiO$_2$ layer, a silicon nitride layer, or a layer mainly containing SiO$_2$ or silicon nitride.

8. The elastic wave device according to claim 1, wherein a surface of the dielectric layer opposite to a surface that is adjacent to the piezoelectric component is substantially flat.

9. The elastic wave device according to claim 1, wherein a surface of the dielectric layer opposite to a surface that is adjacent to the piezoelectric component has an uneven shape corresponding to the shapes of the plurality of electrode fingers.

10. The elastic wave device according to claim 1, wherein a wavelength-normalized thickness defined by normalizing the thickness of the dielectric layer by the wavelength of an elastic wave at a portion where the electrode fingers are located is in the range of about 0.01 to about 0.4.

11. The elastic wave device according to claim 1, wherein the piezoelectric component is a LiTaO$_3$ substrate or a LiNbO$_3$ substrate.

12. The elastic wave device according to claim 1, wherein the elastic wave device is a surface acoustic wave device.

13. The elastic wave device according to claim 1, wherein the elastic wave device is a boundary acoustic wave device.

* * * * *